(12) United States Patent
Mears et al.

(10) Patent No.: US 7,123,792 B1
(45) Date of Patent: Oct. 17, 2006

(54) CONFIGURABLE APERIODIC GRATING DEVICE

(75) Inventors: Robert Joseph Mears, Cambridge (GB); Michael Charles Parker, Essex (GB)

(73) Assignee: RJ Mears, LLC, Waltham, MA (US)

( * ) Notice: Subject to any disclaimer, the term of this patent is extended or adjusted under 35 U.S.C. 154(b) by 0 days.

(21) Appl. No.: 09/914,944

(22) PCT Filed: Mar. 3, 2000

(86) PCT No.: PCT/GB00/00768

§ 371 (c)(1),
(2), (4) Date: Nov. 25, 2003

(87) PCT Pub. No.: WO00/54080

PCT Pub. Date: Sep. 14, 2000

(30) Foreign Application Priority Data

Mar. 5, 1999 (GB) .................................. 9905196.3
May 21, 1999 (GB) .................................. 9911952.1

(51) Int. Cl.
*G02B 6/34* (2006.01)
(52) U.S. Cl. .......................... 385/37; 385/10; 372/102; 359/130
(58) Field of Classification Search .................. 385/37, 385/7, 4, 10, 13, 14, 15, 11, 24, 27, 31; 372/6, 372/102; 359/130, 161
See application file for complete search history.

(56) References Cited

U.S. PATENT DOCUMENTS

| | | | |
|---|---|---|---|
| 4,485,128 A | 11/1984 | Dalal et al. | 427/85 |
| 4,882,609 A | 11/1989 | Schubert et al. | 357/22 |
| 4,908,676 A | 3/1990 | Yamazaki | 357/4 |
| 5,245,474 A | 9/1993 | Chabassier et al. | 359/578 |
| 5,388,173 A | 2/1995 | Glenn | 385/37 |
| 5,606,177 A | 2/1997 | Wallace et al. | 257/26 |
| 5,666,224 A | 9/1997 | Wood et al. | 359/573 |
| 5,742,433 A | 4/1998 | Shiono et al. | 359/575 |
| 5,867,304 A | 2/1999 | Galvanauskas et al. | 359/333 |
| 6,081,513 A | 6/2000 | Roy | 357/23.7 |
| 6,255,150 B1 | 7/2001 | Wilk et al. | 438/191 |
| 6,322,938 B1 | 11/2001 | Cohn | 430/8 |
| 6,326,311 B1 | 12/2001 | Ueda et al. | 438/694 |
| 6,350,993 B1 | 2/2002 | Chu et al. | 257/19 |
| 6,376,337 B1 | 4/2002 | Wang et al. | 438/478 |
| 6,436,784 B1 | 8/2002 | Allam | 438/380 |
| 6,501,092 B1 | 12/2002 | Nikonov et al. | 257/29 |
| 6,566,679 B1 | 5/2003 | Nikonov et al. | 257/29 |
| 6,621,097 B1 | 9/2003 | Nikonov et al. | 257/17 |
| 2003/0162335 A1 | 8/2003 | Yuki et al. | 438/151 |
| 2003/0215990 A1 | 11/2003 | Fitzgerald et al. | 438/172 |

FOREIGN PATENT DOCUMENTS

EP        0 335 176 A        3/1989

(Continued)

OTHER PUBLICATIONS

Cohn, R. W. et al. Nanolithography Considerations for Multi-Passband Grating Filters. *Optical Review* 6, 345-354 (1999).

(Continued)

*Primary Examiner*—Phan T. H. Palmer
(74) *Attorney, Agent, or Firm*—Allen, Dyer, Doppelt, Milbrath & Gilchrist, P.A.

(57) ABSTRACT

The invention relates to the field of grating structures. The invention provides a longitudinal grating having an aperiodic structure, wherein the grating has a selected response characteristic and any repeated unit cell in the structure is significantly longer than a characteristic length associated with the selected response characteristic.

32 Claims, 30 Drawing Sheets

(a)

(b)

FOREIGN PATENT DOCUMENTS

| | | | |
|---|---|---|---|
| EP | 0712012 | A | 11/1994 |
| EP | 0 843 361 | | 6/1998 |
| JP | 61145820 | A | 7/1986 |
| JP | 61220339 | A | 9/1986 |
| WO | WO 93/14424 | | 1/1993 |
| WO | WO 98/32187 | | 1/1998 |
| WO | 99/63580 | | 12/1999 |

OTHER PUBLICATIONS

DeChiaro, L. F. Spectral Width Reduction in Multilongitudinal Mode Lasers by Spatial Loss Profiling. *J. Lightwave Technology* 9, 975-986 (Aug. 1991).

Erni, D. et al. Evolutionary optimization of non-periodic coupled-cavity semiconductor laser diodes. *Optical and Quantum Electronics* 30, 287-303 (1998).

Kozlowski, D. A. et al. Time-Domain Modeling of Mode Suppression in 1.3-μm Fabry-Perot Lasers. *IEEE Photonics Technology Letters* 8, 755-757 (Jun. 1996).

Tsang, H. K. et al. Etched Cavity InGaAsP/InP Waveguide Fabry-Perot Filter Tunable by Current Injection. *J Lightwave Technology* 17, 1890-1895 (Oct. 1999).

Chang, C.P. et al: "Optimization of a thin-film multilayer design by use of the generalized simulated-annealing method", Optics Letters, 15, No. 11, pp. 595-597 (Jun.1, 1990).

Dobrowolski, J.A.: "Computer design of optical coatings", Thin Solid Films, 163, pp. 97-110 (1988).

G. Sarlet et al "Optimization of Multiple Exposure Gratings for Widely Turnable Lasers", IEEE Photonics Technology Letters, 11, pp. 21-23 (1999).

International Search Report listing references cited.

Patent Abstracts of Japan, vol. 012, No. 080 (E-590), Mar. 12, 1988 & JP 62 219665 A (Fujitsu Ltd), Sep. 26, 1987 abstract.

Patent Abstracts of Japan, vol. 010, No. 179 (E-414), Jun. 24, 1988 & JP 61 027681 A (Res Dev Corp of Japan), Feb. 7, 1985 abstract.

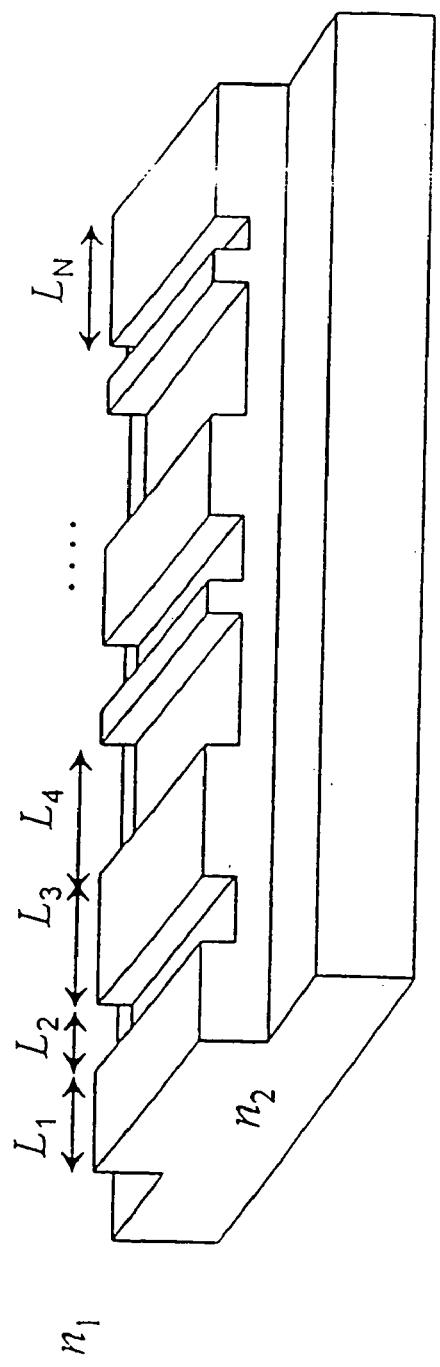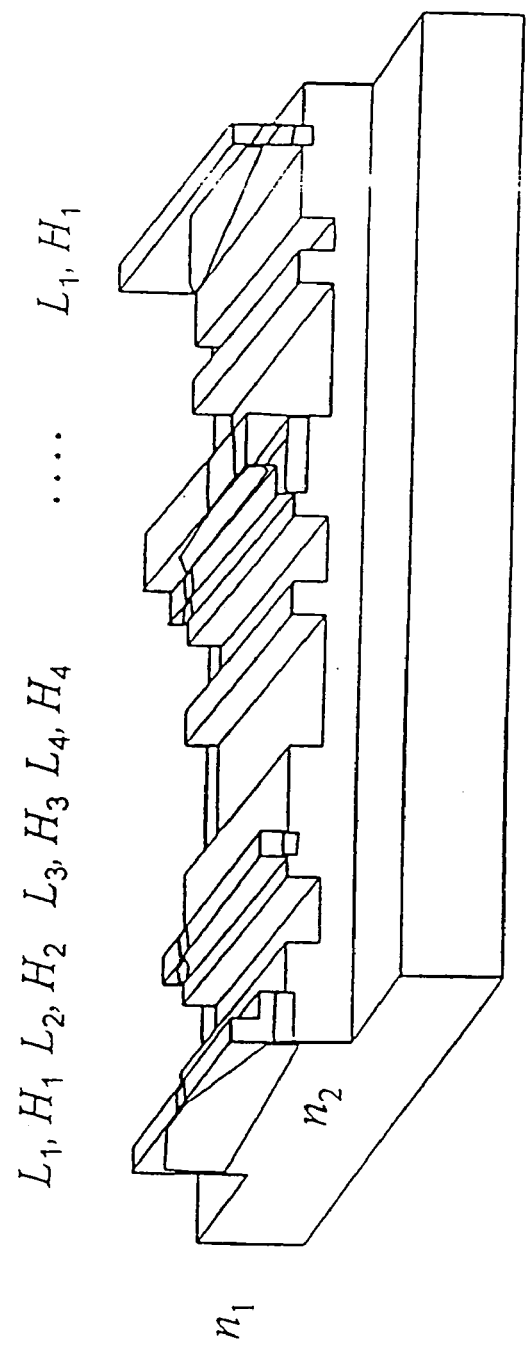
Fig. 12
(a)
(b)

CONFIGURABLE APERIODIC GRATING DEVICE

This Application relates to the field of grating structures. There has been much interest in both regular and chirped grating structures to define and/or modify the response characteristics of optical and other devices which utilise the properties of wave-like phenomena such as electromagnetic (EM) waves. Examples of devices utilising such structures include Fibre Bragg Gratings (FBGs) and apodised FBGs, in which a slowly-varying chirp is superposed on the grating. Periodic grating structures have been the focus of much attention in a very wide range of applications; for example, in photonic crystals, wherein the band structure may be defined by analogy with the well-known (Bloch) periodic lattice analysis of solid-state physics.

Existing devices are based upon grating structures which are regular in some sense or other. Although various groups have already claimed the use of "aperiodic" gratings or structures in their work, those structures are slowly varying aperiodic structures. A hologram would be an example of a fast-varying structure but is transverse. In this application, "slowly varying" when used in relation to grating structures means that the variation in the structure of the grating has a period significantly longer than the wavelength being filtered. That distinction is explained further below.

In accordance with the invention there is provided a logitudinal grating as defined in claim 1 and a method of making the same as defined in claim 99.

If all possible aperiodic gratings were to be considered then the vast majority of possible gratings will not have a useful response characteristic and, for gratings with more than a few elements, the skilled person has no way to find a aperiodic grating having a response characteristic that he or she has selected as being useful. Indeed, we believe that it is unlikely that he would expect aperiodic gratings in general to have any useful response characteristic at all.

Although aperiodic structures do not, in general, exhibit a useful band structure, by means of a simple approximate analysis we have found aperiodic structures that exhibit a controllable and useful band structure. At the heart of this analysis is the understanding that it is not the regular periodicity of the real space lattice, but rather the existence of well-defined spatial frequencies (e.g. as revealed by the Fourier Transform (FT) of such an aperiodic structure), which distinguishes a useful aperiodic structure from the vast majority of non-useful (random) aperiodic structures. Thus, we have realised that the Fourier Transform of an aperiodic grating structure is closely related to its spectral response.

It should be noted that the relevant transform may not be the exact Fourier Transform $$g(\underline{k}) = F \cdot T \cdot [f(\underline{x})] = \frac{1}{2\pi} \int_{-\infty}^{+\infty} f(\underline{x}) e^{-i\underline{k}\cdot\underline{x}} d\underline{x}$$

but may be a scaled version thereof. The transform will belong to the same class of transforms as a Fourier Transform, but may include scaling factors such as a constant multiplier before the integral or in the exponential component. References to Fourier Transforms to embrace such scaled Transforms and also Fast Fourier Transform equivalents.

We believe that the invention will have widespread applications. In general, material response characteristics result from properties of the atoms making up the material. The characteristics may result directly from the properties of the electrons surrounding the atoms or from the atoms' nuclei or from the arrangement of the atoms relative to each other. It can be seen that the invention makes possible the selection of properties of a material by the introduction of a suitable variation in the atoms making up the material. For example, in an embodiment discussed below, the variation is in refractive index, which can be related to the response of an atom's electrons to an incident EM field.

We have chosen to call an aperiodic structure according to the invention (when applied to photonic structures) an Aperiodic Photonic Band-Gap (APBG) structure. The term A-Periodic Bragg Grating could also be applied to the structures and has the same acronym.

Our APBG structures can be classed as fast-varying structures, which differentiates them from slowly-varying aperiodic structures such as a simple chirped-grating. They are also longitudinal aperiodic structures, which differentiates them from holograms employed in transverse situations.

In the following mathematical discussions, we make a distinction between the underlying grating structure and an overall slowly-varying windowing function, which might be applied so as to apodise the overall response. A windowing function applied to a uniform, periodic grating will tend to yield an overall structure that is aperiodic within the strictest meaning of the term. However, it is the aperiodicity of the underlying grating structure, as discussed below which is of concern here.

An APBG grating (defined below as H) is a structure which cannot be expressed as a simple transformation of a regular grating. In particular the present invention does not include any of the following gating structures:

(1) Chirped Gratings

Often, a chirped grating is described as an aperiodic grating, which is technically correct in the strictest meaning of the term. A regular grating can be mathematically described in the following manner:

$$\underline{G} = T_G(\underline{x})$$

where $\underline{G}$=Regular Grating;

$T_G$=Grating Transformation/Matrix function;

$\underline{x}$=spatial dimension.

The Grating Transformation/Matrix function may be any function which produces a regular grating in the spatial domain.

A binary regular grating has a unit cell may be of equal mark-space ratio; graphically: ⎯⎣_. So, a binary grating has regions of constant refractive index having one of two possible values. A sine wave is another example of a regular grating.

However, a chirped grating can be described by a linearly-chirped or stretched regular grating thus:

$$\underline{C} = T_G(\underline{x}^2)$$

where $\underline{C}$=resulting chirped grating.

The spatial dimension $\underline{x}$ has undergone a simple, continuous transformation (i.e. it has been squared). This APGB i.e $\underline{H} \neq \underline{C}$ But an APBG cannot be so simply expressed as the regular C grating transformation function $T_G$ operating on some 'simple', continuous function of the spatial dimension $f(\underline{x})$, $$\underline{H} \neq T_G(f(\underline{x}))$$

[n.b. for the binary case, such a function f($\underline{x}$) can be found—in general being a polynomial of an order comparable with the number of elements in the APBG $\underline{H}$. However, that is not a simple function, in comparison with the chirped case, in which it is merely a $2^{nd}$ order polynomial. Slowly-varying gratings are often characterised by a low-order polynomial, e.g. a chirped grating.].

(2) Superposition of a Small Number of Regular Gratings

Likewise, an APBG grating is a structure which cannot be expressed as a limited summation of regular gratings of various spatial frequencies:

$$\underline{H} \neq \sum_{i}^{N} a_i \underline{G}_i$$

where
  $a_i$=amplitude
  $\underline{G}_i$=regular grating of $i^{th}$ spatial frequency For example the superposition of two gratings of similar but not identical frequencies will produce a "beat" variation at the difference frequency. A similar effect will occur with the superposition of, for example, three or four frequencies.

Further an APBG does not include grating derived by caking the superposition of a number of regular gratings and quantising the resultant grating function to a small number of levels, for example, generating a binary grating by thresholding the said resultant grating function. The binary grating will typically have regions with few changes of level corresponding to nodes of the envelope of the resultant of the superposition interspersed with regions of regular changes of the level the period of which increases towards the antinodes of the envelope function.

(3) Concatenated Regular Gratings

Likewise, an APBG grating is a structure which cannot be simply expressed as a set of concatenated regular gratings of varying spatial frequency:

$\underline{H} \neq [\underline{G}_1, \underline{G}_2, \underline{G}_3, \ldots, \underline{G}_i, \ldots, \underline{G}_N]$ where $\underline{G}_i = i^{th}$ regular grating.

Each $\underline{G}_i$ is, of course, not infinite in extent but is windowed having a beginning and an end.

(4) Apodised Slowly Varying Gratings

An apodised grating A($\underline{x}$) can be characterised by multiplication of the basic structure with a slowly-varying windowing-function W(x), such as a raised-cosine, or a Gaussian function. The resulting apodised grating will often be technically aperiodic, and is mathematically described as:

A($\underline{x}$)=W($\underline{x}$)·$\underline{G}$ for an apodised regular grating,
  A($\underline{x}$)=W($\underline{x}$)·$\underline{C}$ for an apodised chirped grating
  A($\underline{x}$)=W($\underline{x}$)·$T_G(f(\underline{x}))$ for an apodised slowly-varying grating structure An APBG or longitudinal hologram $\underline{H}$ requires a special Hologram Transformation/Matrix function $T_H$ to produce the aperiodic structure in the spatial domain $\underline{x}$, such that in general we have:

$\underline{H} = T_H(\underline{x})$

The resulting hologram may be in general characterised as fast-varying.

We thus distinguish between an overall aperiodic (slowly-varying) structure resulting from the apodisation of a periodic structure, and an intrinsically aperiodic (fast-varying) structure such as an APBG. Naturally, it may be desirable to apodise APBG structures using a standard windowing function, to yield an apodised structure mathematically described as:

A($\underline{x}$)=W($\underline{x}$)·$\underline{H}$ for an APBG structure.

The Fourier-Transform (FT) of an APBG structure will reveal its spectral distribution; i.e., the spatial period components which make it up. We have discovered that the transmission function of an APBG, be it used, for example, for grating-assisted coupling, as a photonic bandgap crystal, filter, or within Mach-Zehnder configuration, is closely related to its spectral distribution; that is, the Fourier Transform of its spatial structure. Hence, an APBG is best designed by tailoring its spectral distribution (or the FT of its spatial distribution) to yield the desired spectral response. Superficially, that appears easy, as the required spatial distribution is thus merely the inverse FT (which is of course, equivalent to the FT) of the desired spectral response. However, the FT of a spectral distribution function will tend to yield a complex spatial distribution (i.e. containing both real and imaginary components). That is equivalent to a permittivity distribution containing both absorptive components (i.e. imaginary refractive index) and dielectric components (i.e. real refractive index), which is difficult to realise in practice.

The present invention arises from the realisation that generally only the modulus of the spectral distribution is of interest (e.g. for power equalisation, filtering, the existence of certain spatial periods etc.) and that its phase characteristic is of negligible importance (N.B. that is not the case for APBGs designed for dispersion compensation, where the dispersion characteristic is given by the second differential of the phase characteristic: see below). If the phase characteristic/response is allowed to be a degree of freedom, then a spatial distribution can be designed, which preferably consists only of a real or an imaginary component. The FT of that spatial distribution will yield a spectral distribution with the desired amplitude distribution, but an arbitrary phase distribution. One aspect of the invention lies in providing a suitable spatial distribution, which is preferably purely real or purely imaginary, and yields the desired spectral response.

The two constraints in the calculation are on each side of the FT. The first constraint is the actual amplitude characteristic of the spectral distribution, while the second constraint is that the required spatial characteristic is preferably either purely real or purely imaginary. That allows simple fabrication because the real and imaginary material characteristics are usually controlled in different ways. Together, those two constraints make calculation of the required spatial characteristic a non-deterministic problem. It can be solved using optimisation algorithms such as simulated annealing (which is what we have used), error-diffusion, genetic algorithms etc.

In addition, we have discovered that often we can put a further constraint on the calculation, without unduly affecting the efficacy or functionality of the resulting APBG solution. That further constraint is to make the required spatial characteristic binary in nature. A binary spatial characteristic has the immediate advantage of being much simpler to fabricate, compared with a continuous spatial characteristic, while still yielding all the desired functionalities inherent to an APBG.

Naturally, other multi-level (M-ary), or discretised spatial characteristic solutions can also be employed to make an APBG.

For functionalities such as dispersion compensation, where the phase characteristic of the spectral distribution is important, we need to introduce an additional constraint into the calculation. Instead of just desiring a certain magnitude of the spectral distribution response, we are now interested in both the real and imaginary amplitude characteristics respectively, both of which we try to tailor. However, the phase characteristic is not completely specified but is merely constrained to have a particular second derivative. The tangent of the phase characteristic is merely the ratio of the imaginary amplitude characteristic to the real amplitude characteristic. To achieve a reasonably effective solution, we may have to relax the constraint of a binary spatial characteristic, and allow it to become multi-level (M-ary), or continuous. It is important to note, however, that ultimately, we are still tailoring the amplitude of the spectral response, rather than the phase directly.

Preferred features of the invention are set out in the dependent claims.

One way to test whether a particular grating could have been made by a method according to the invention would be to compare the response characteristic of the grating in question with the idealised function to which it corresponds (which might be, for example, a low-pass filter). If the response characteristic is sufficiently close to the idealised function for the grating to have been accepted had it been generated during the optimisation process, then it is reasonable to assume that the grating could have been designed using that process.

Embodiments of the invention will now be described, by way of example, with reference to the accompanying drawings of which:

Figure 6:
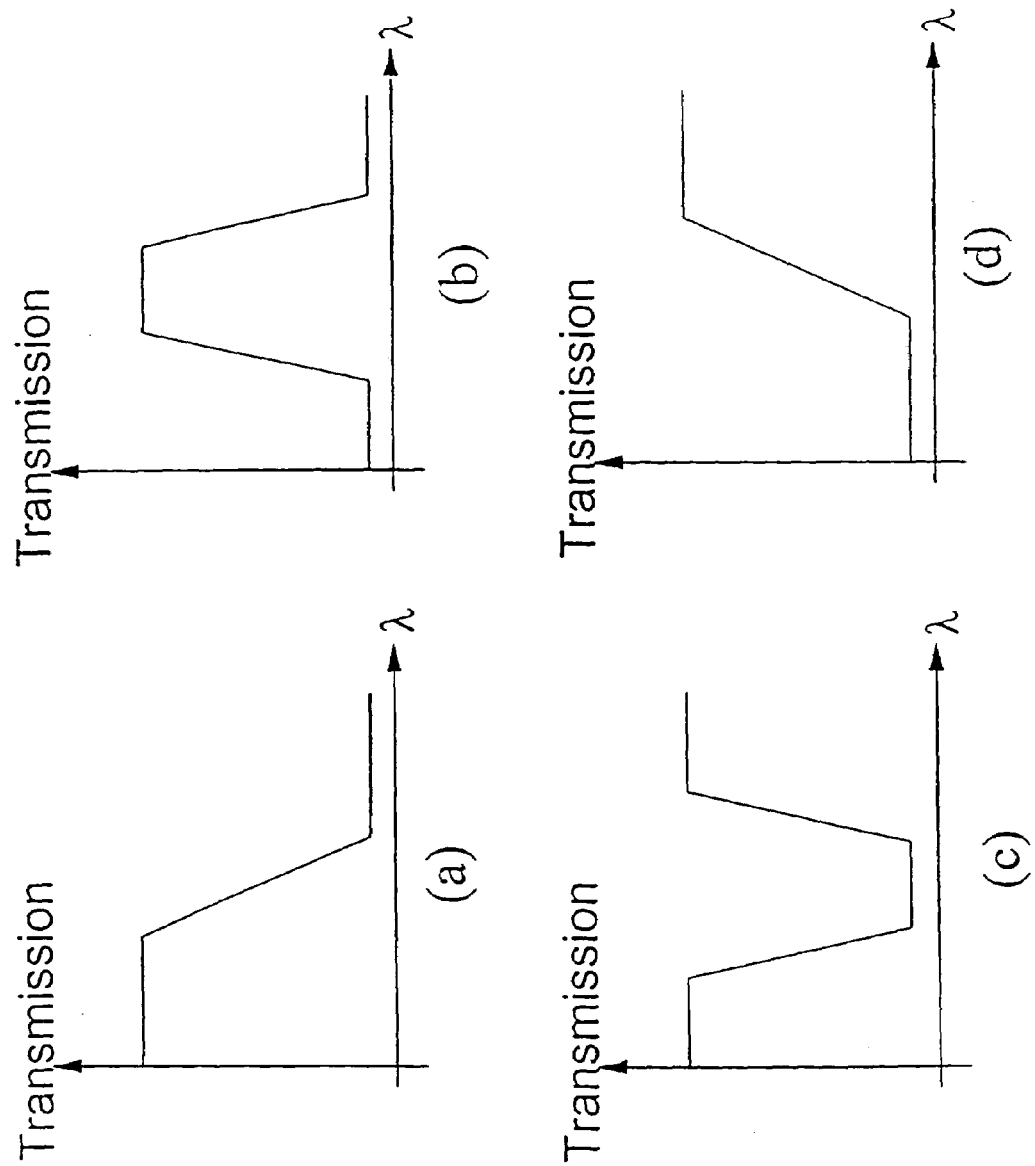
Figure 7:
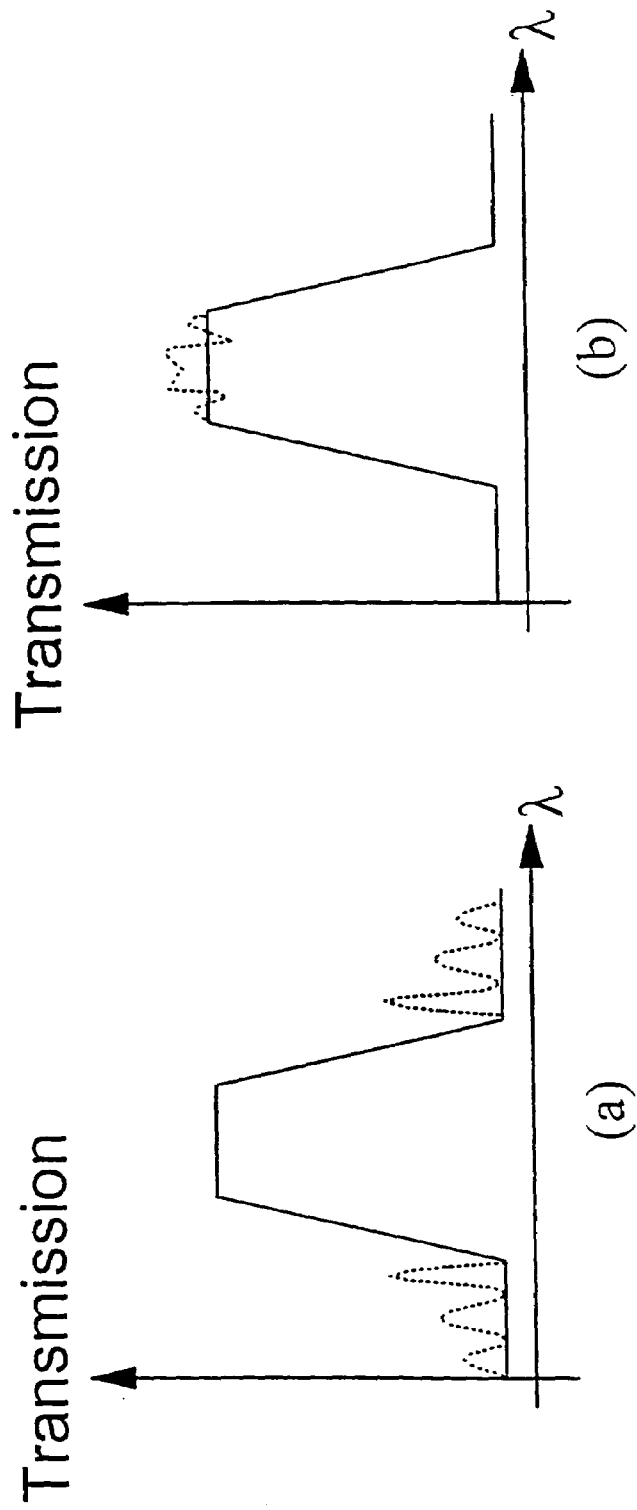
Figure 8:
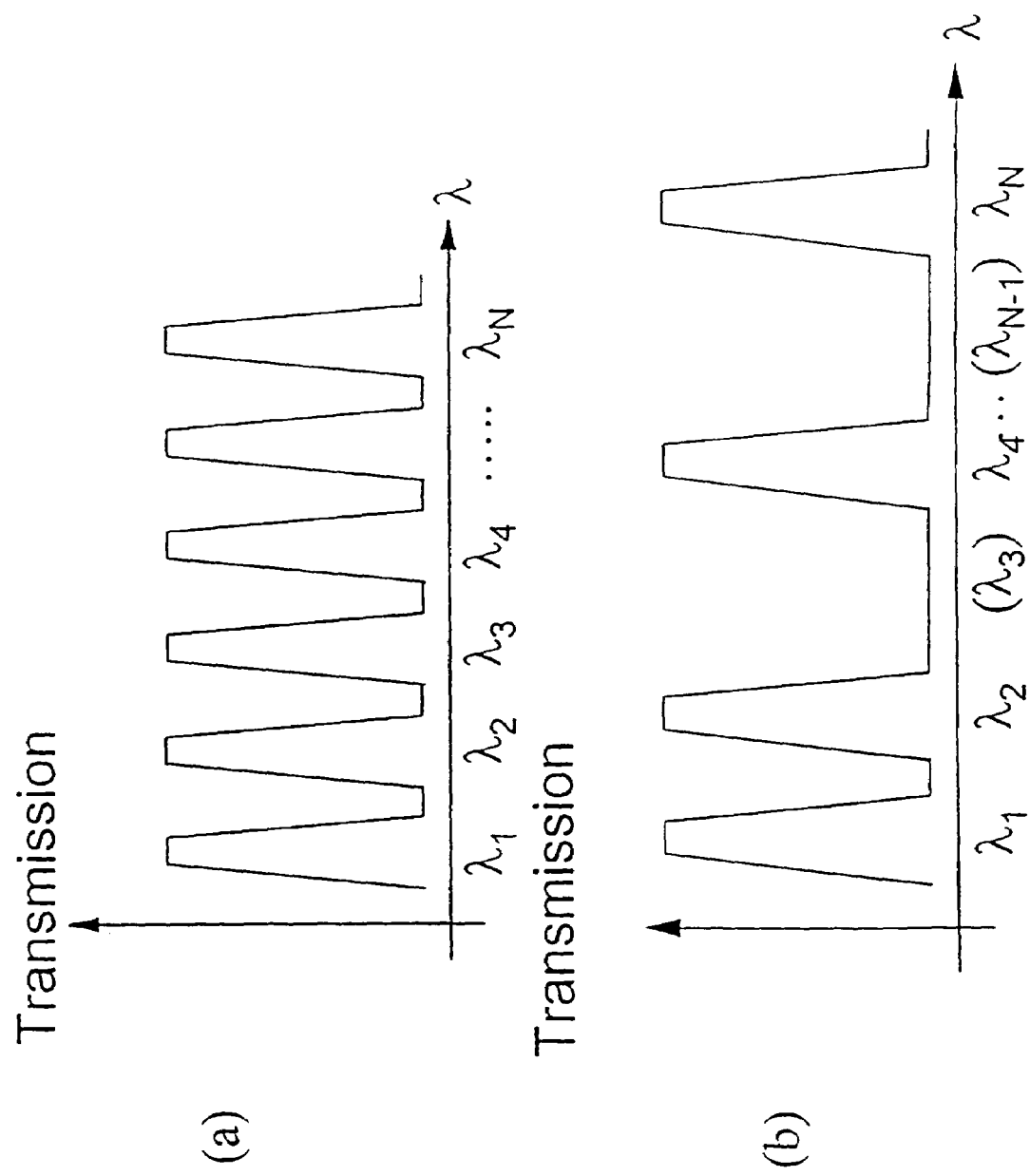
Figure 9:
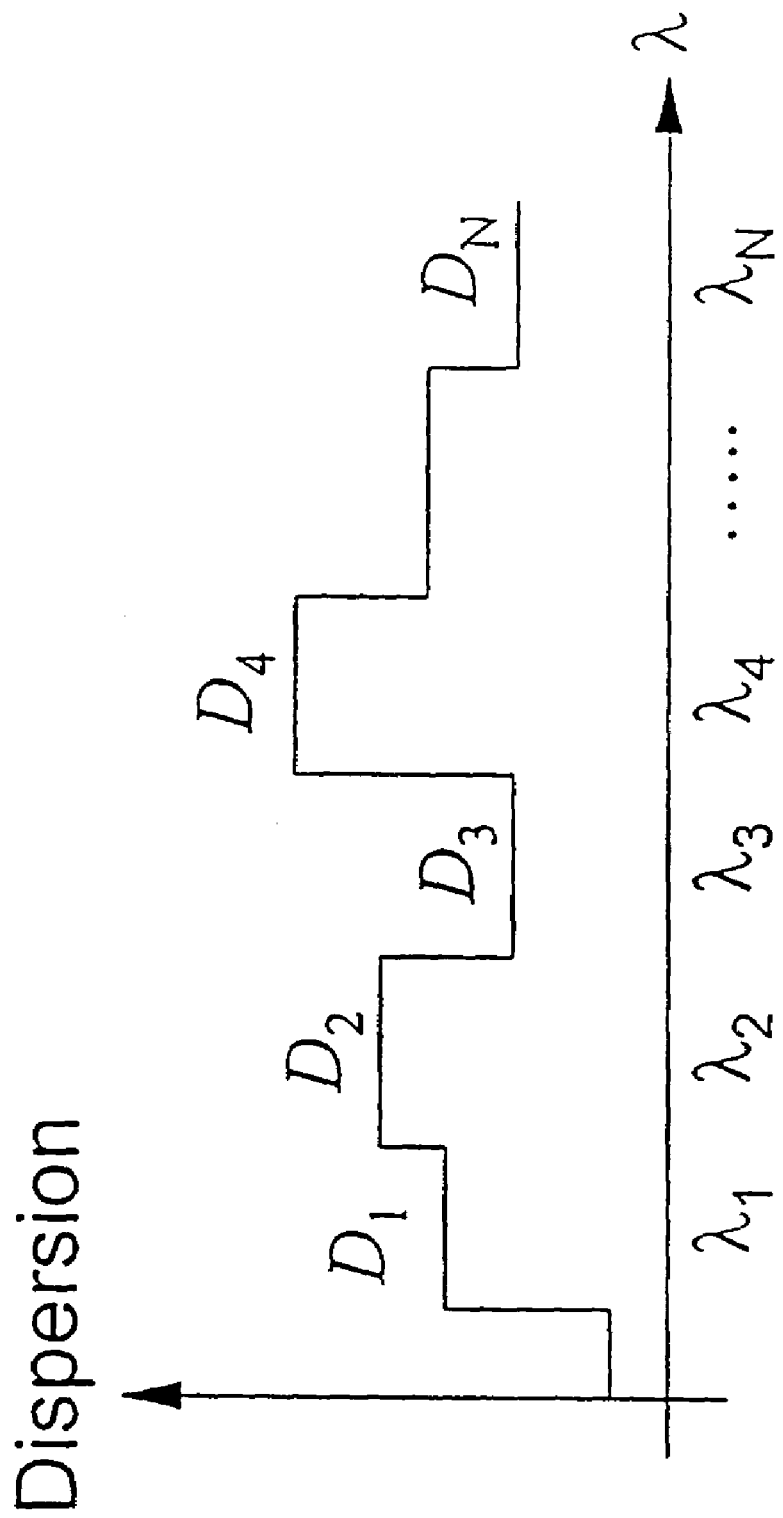
Figure 13:
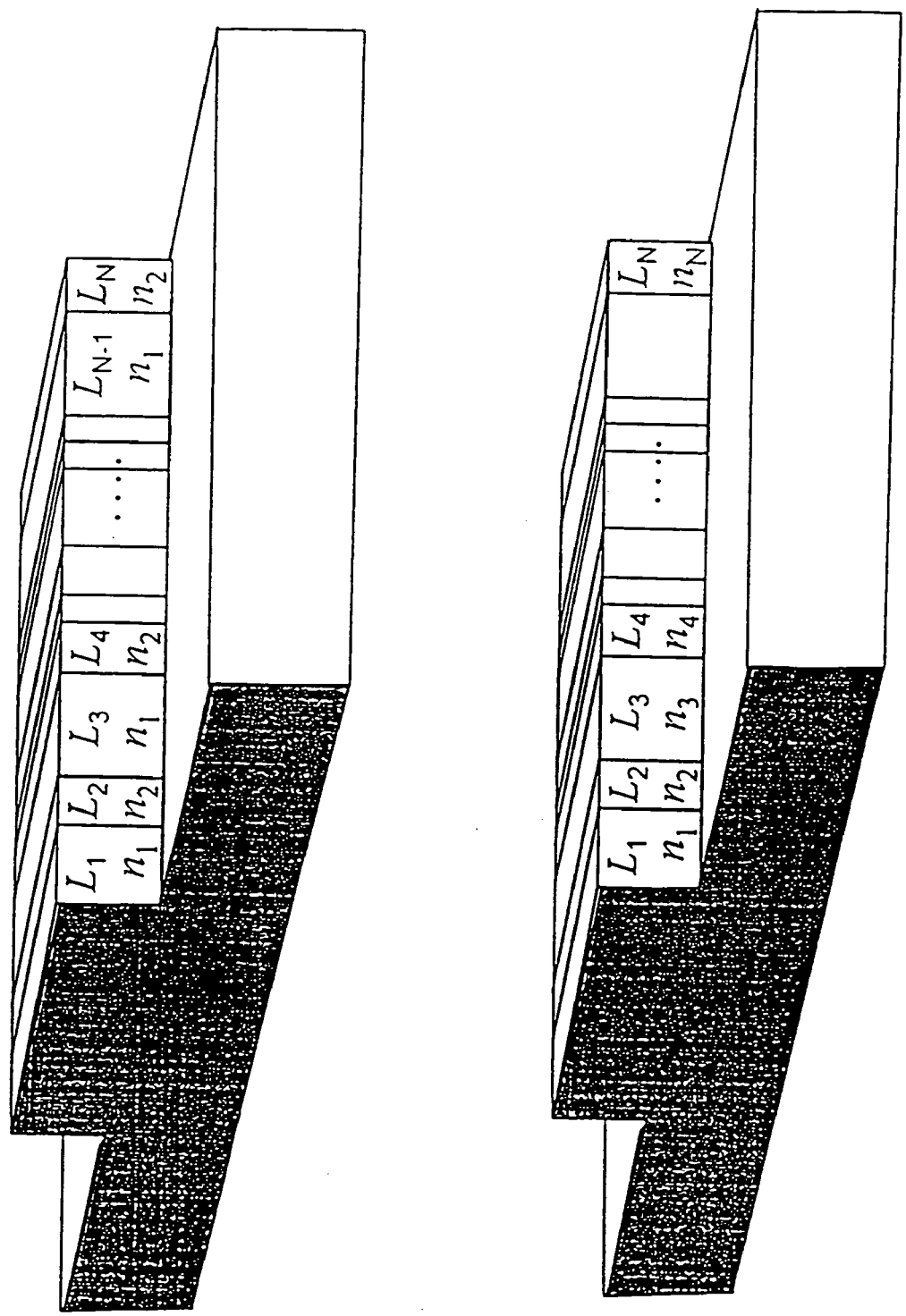
Figure 14:
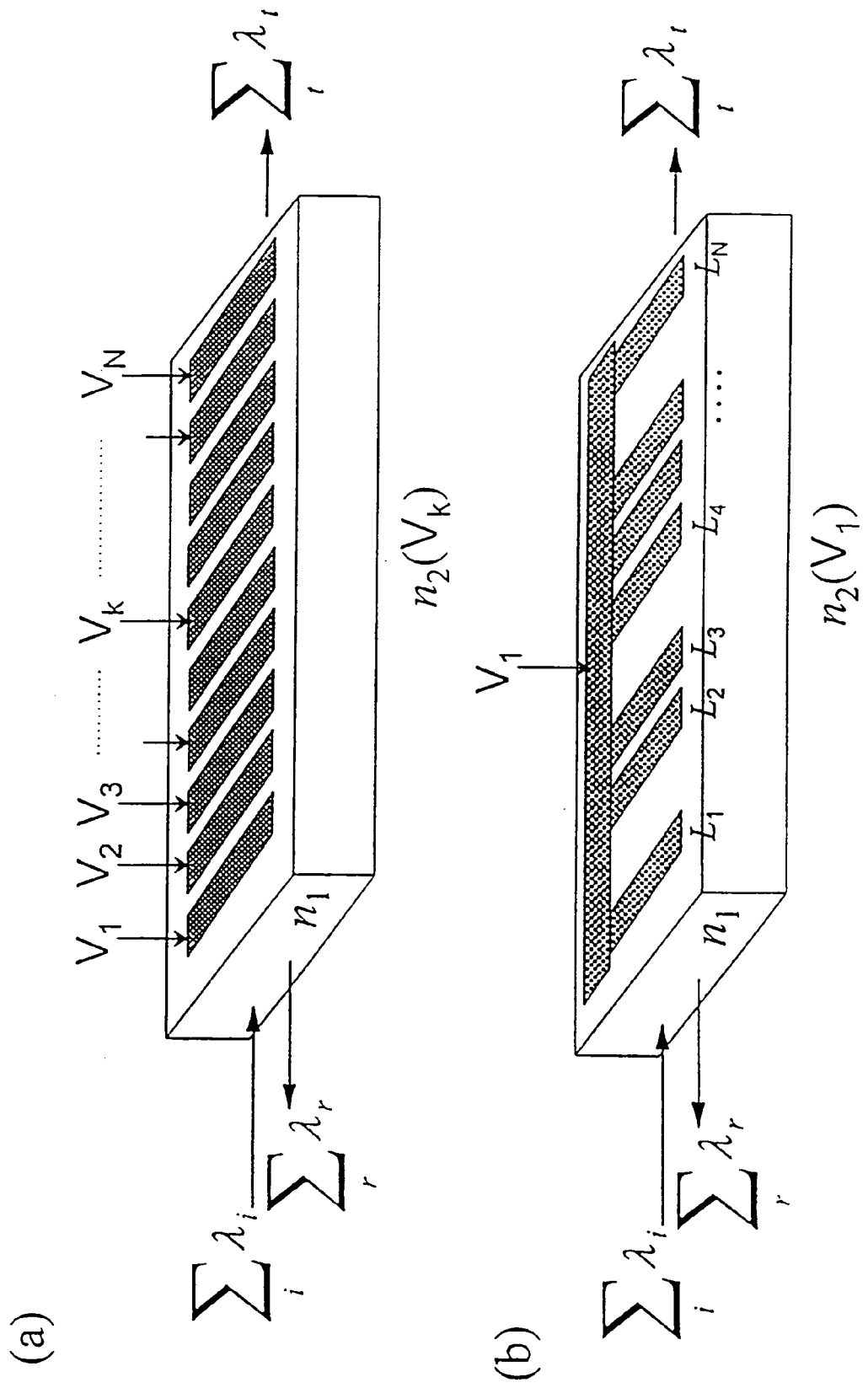
Figure 15:
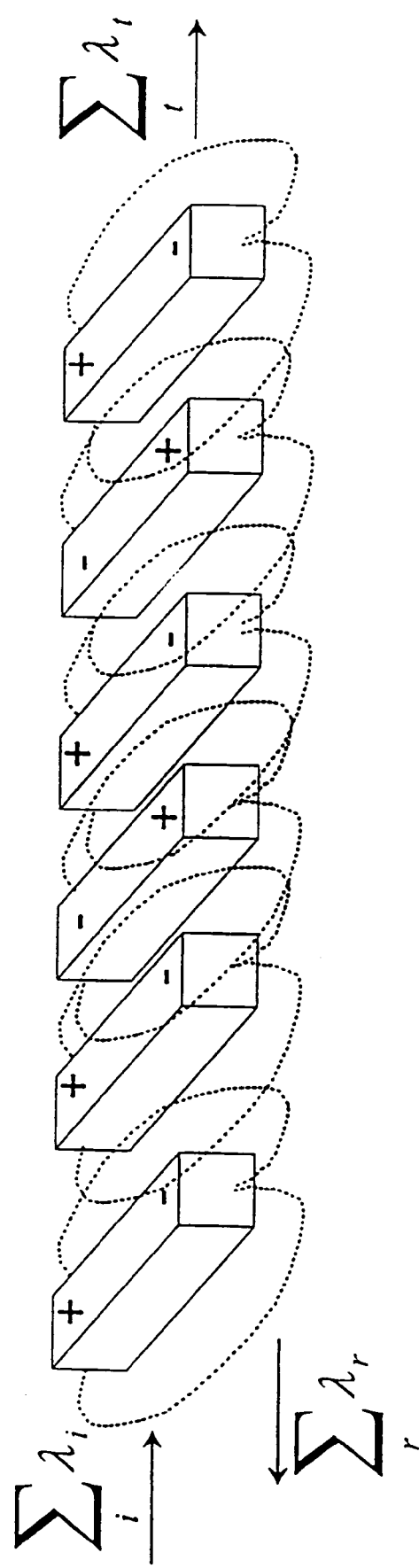
Figure 16:
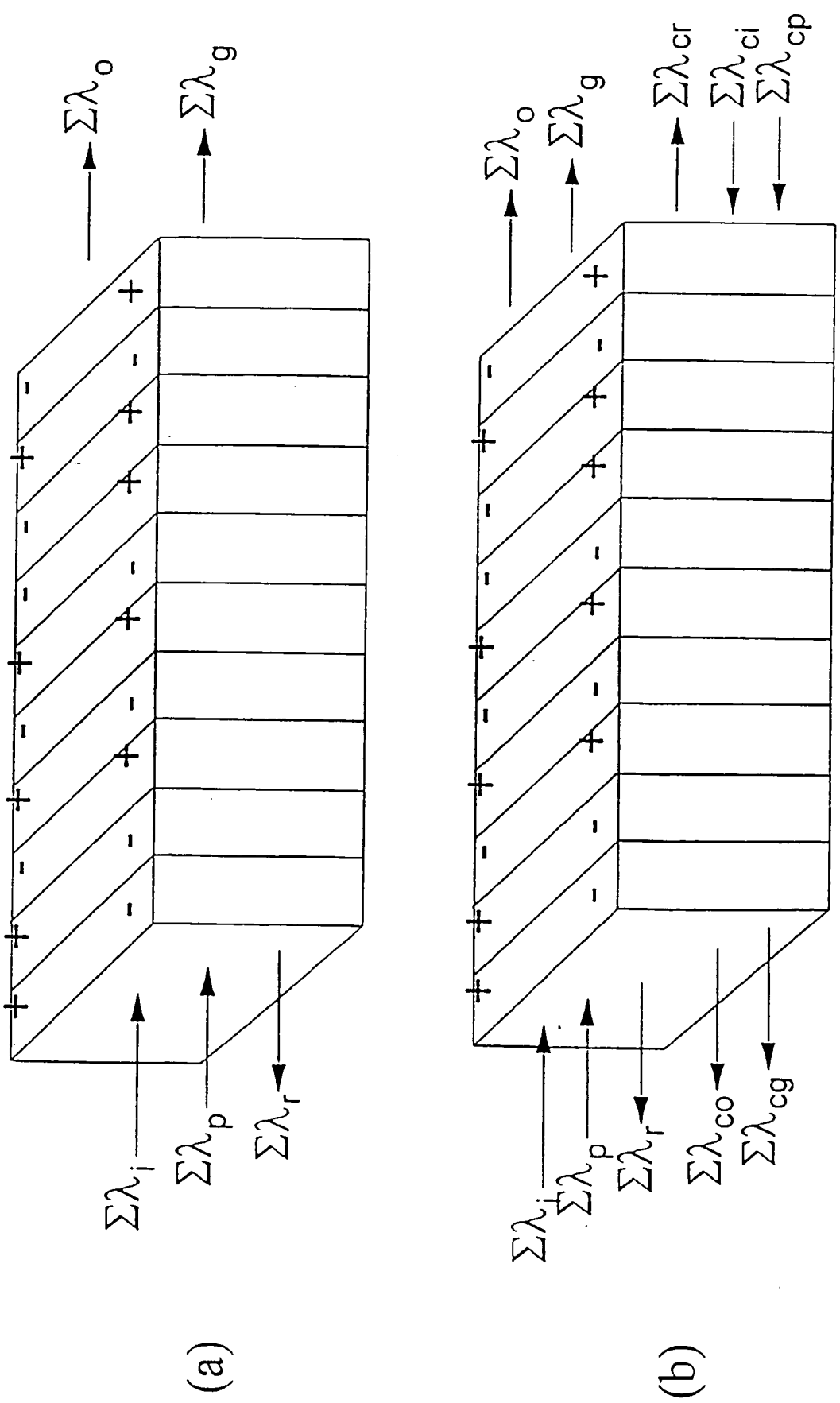
Figure 17:
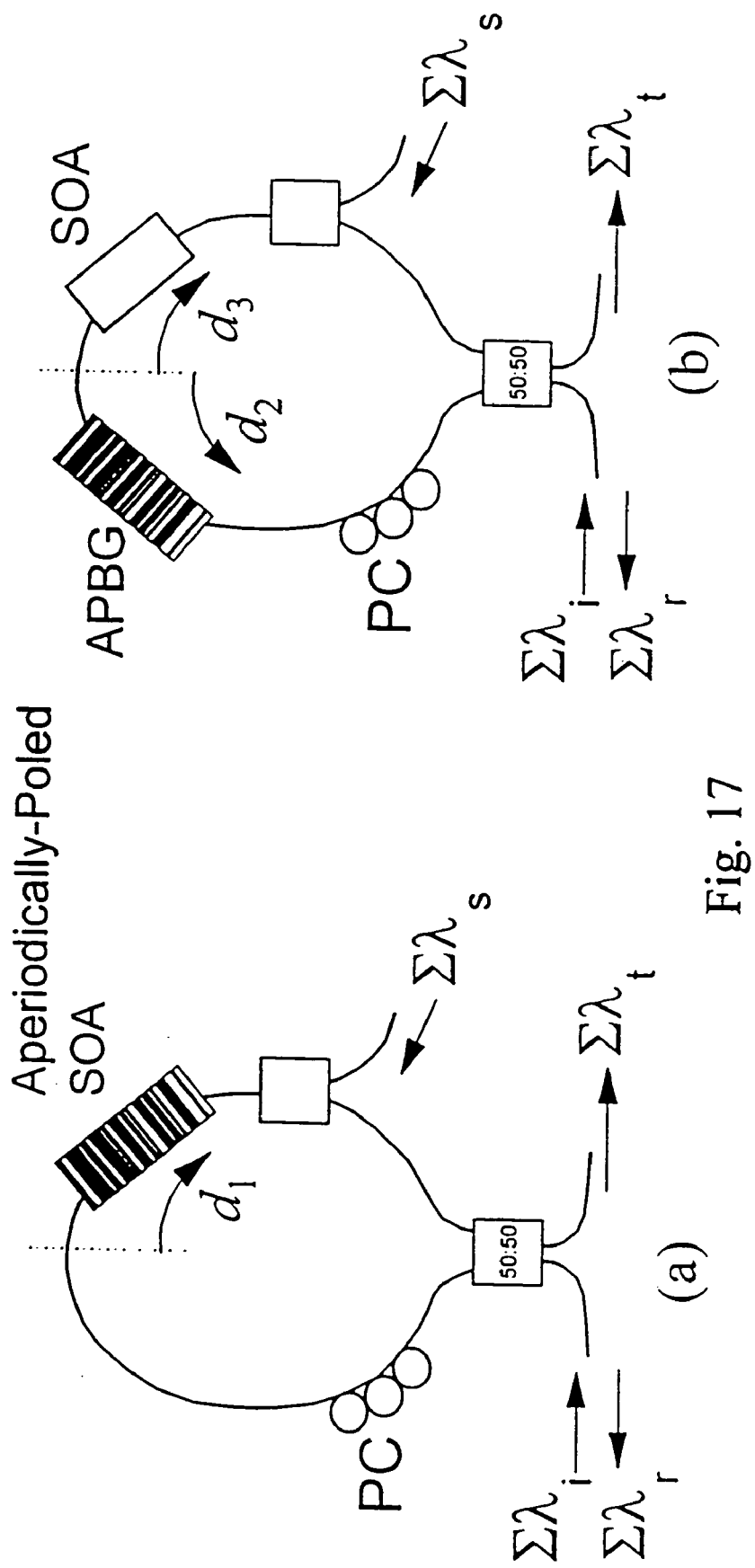
Figure 17:
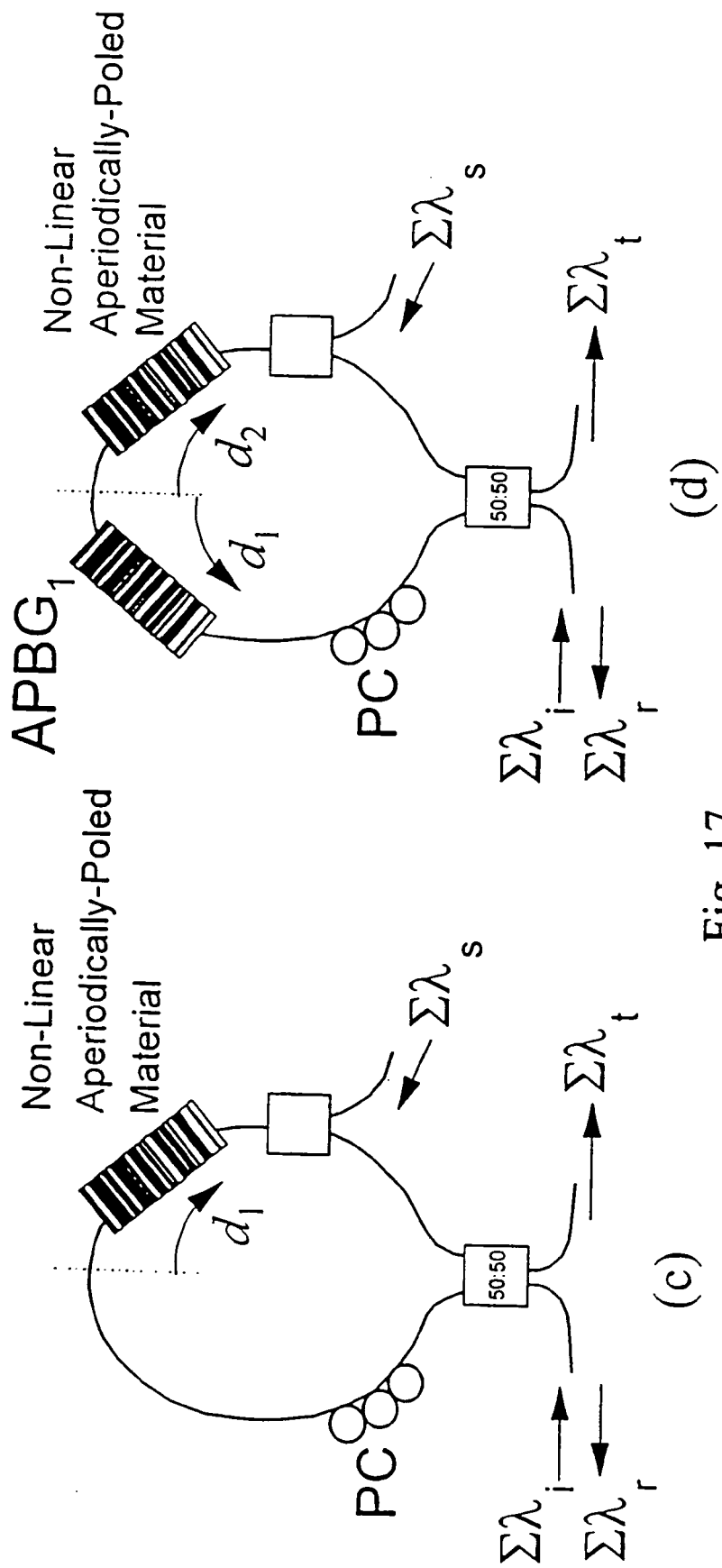
Figure 17E:
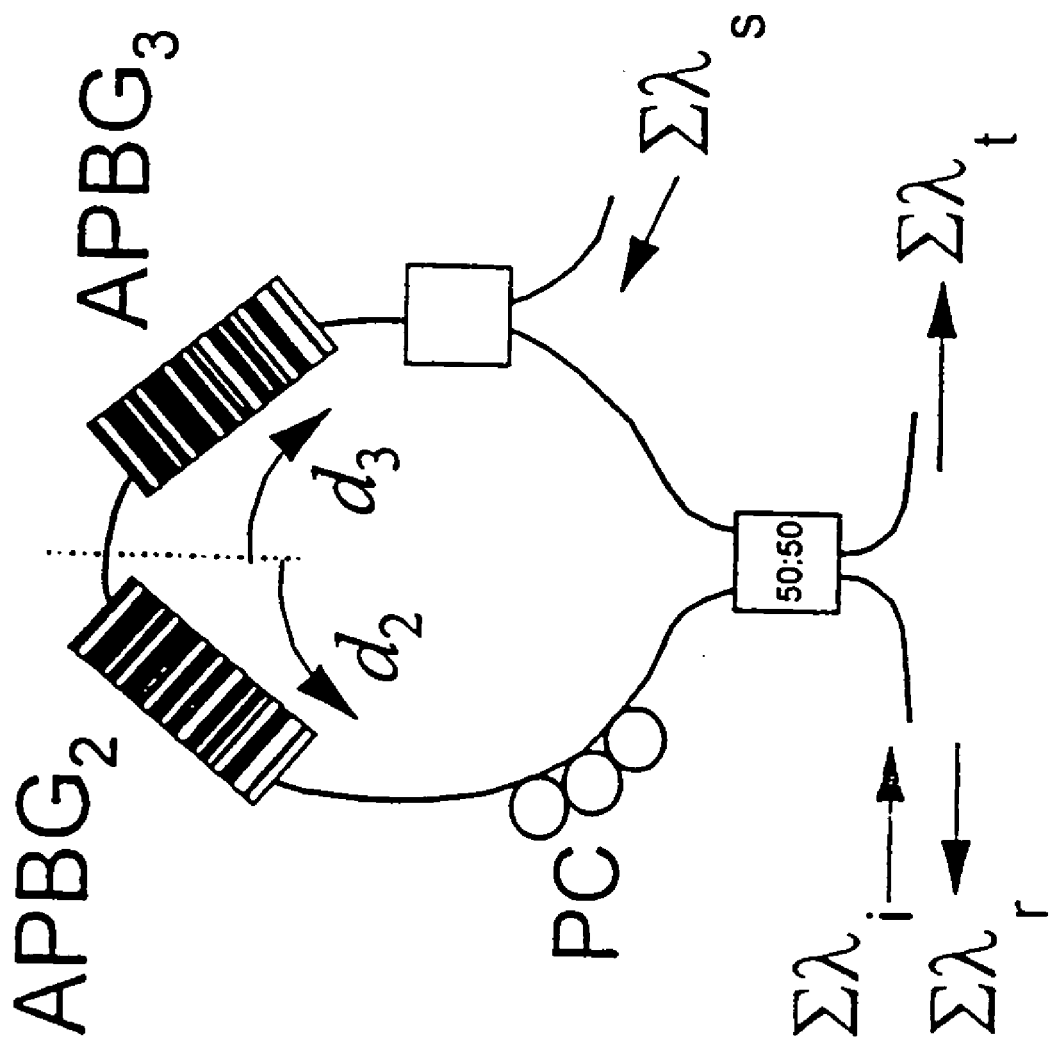

FIG. 6 shows various desirable simple filter characteristics:
 (a) high pass
 (b) pass band
 (c) notch
 (d) low pass FIG. 7 shows further desirable filters:
 (a) apodised passband
 (b) pass-band with flattened passbands FIG. 8 shows still further filter characteristics:
 (a) uniform comb
 (b) add/drop multiplexing
 (c) equalisation FIG. 9 shows an example filter characteristic for multi-wavelength dispersion compensation;

FIG. 10 shows an aperiodic dielectric stack, having:
 (a) two refractive indices (binary); and
 (b) multiple refractive indices FIG. 11 shows an aperiodic fibre Bragg grating, being:
 (a) a binary grating; and
 (b) a multiple refractive index grating FIG. 12 shows aperiodic DFB/DBR ribbed waveguiding/stripline structures:
 (a) binary structure
 (b) multiple heights structure FIG. 13 shows aperiodic DFB/DBR waveguiding/stripline structures:
 (a) binary structure
 (b) multiple refractive index structure FIG. 14 shows programmable APBG structures:
 (a) multiple voltages
 (b) single voltage FIG. 15 shows a magnetic APBG filter, with aperiodically orientated (ferromagnetic) dipoles;

FIG. 16 shows aperiodically-poled non-linear material, (for example, aperiodically-poled lithium niobate):
 (a) unidirectional
 (b) bidirectional FIG. 17 shows an APBG within a non-linear loop mirror/TOAD configuration, for multi-wavelength, high-speed optical time-domain signal processing, in five configurations, labelled (a)–(e).

Figure 18:
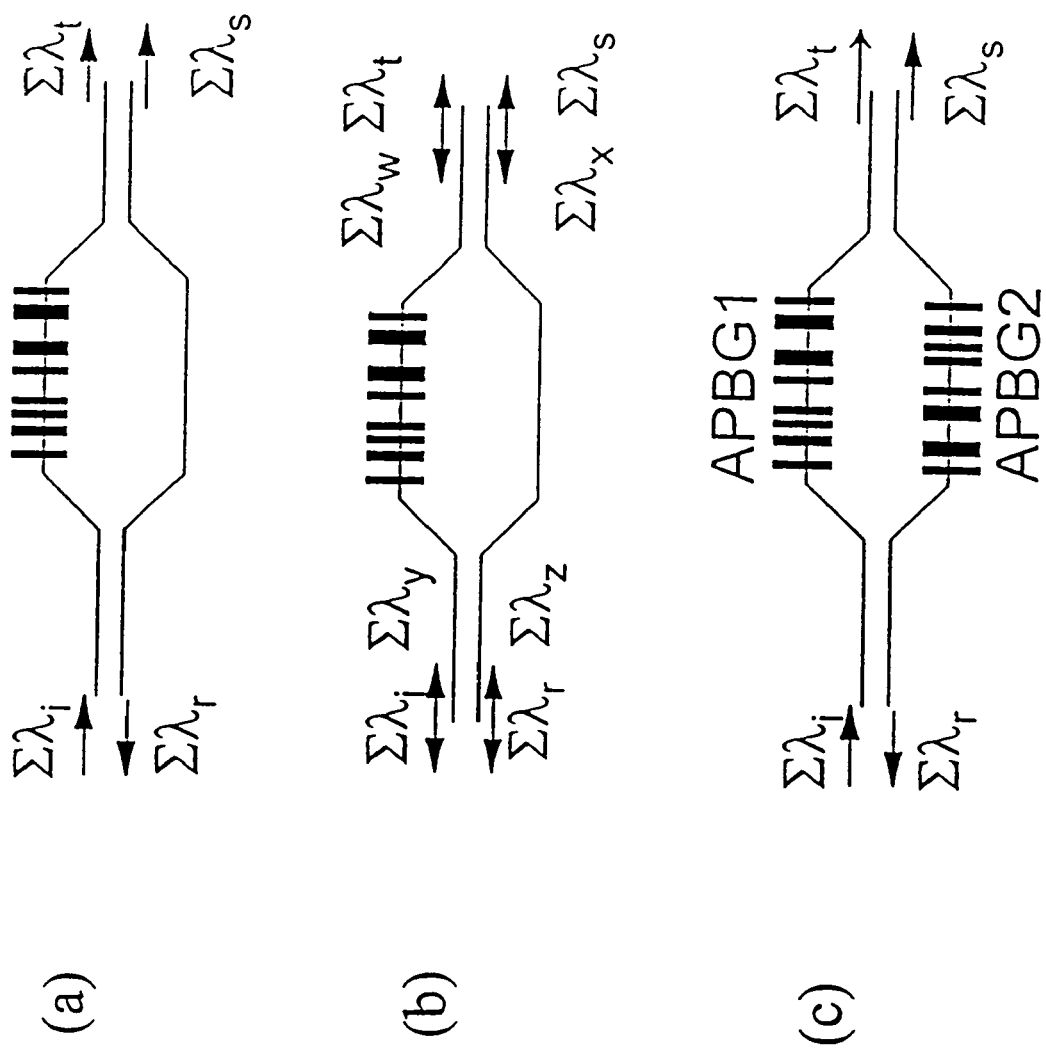
Figure 18:
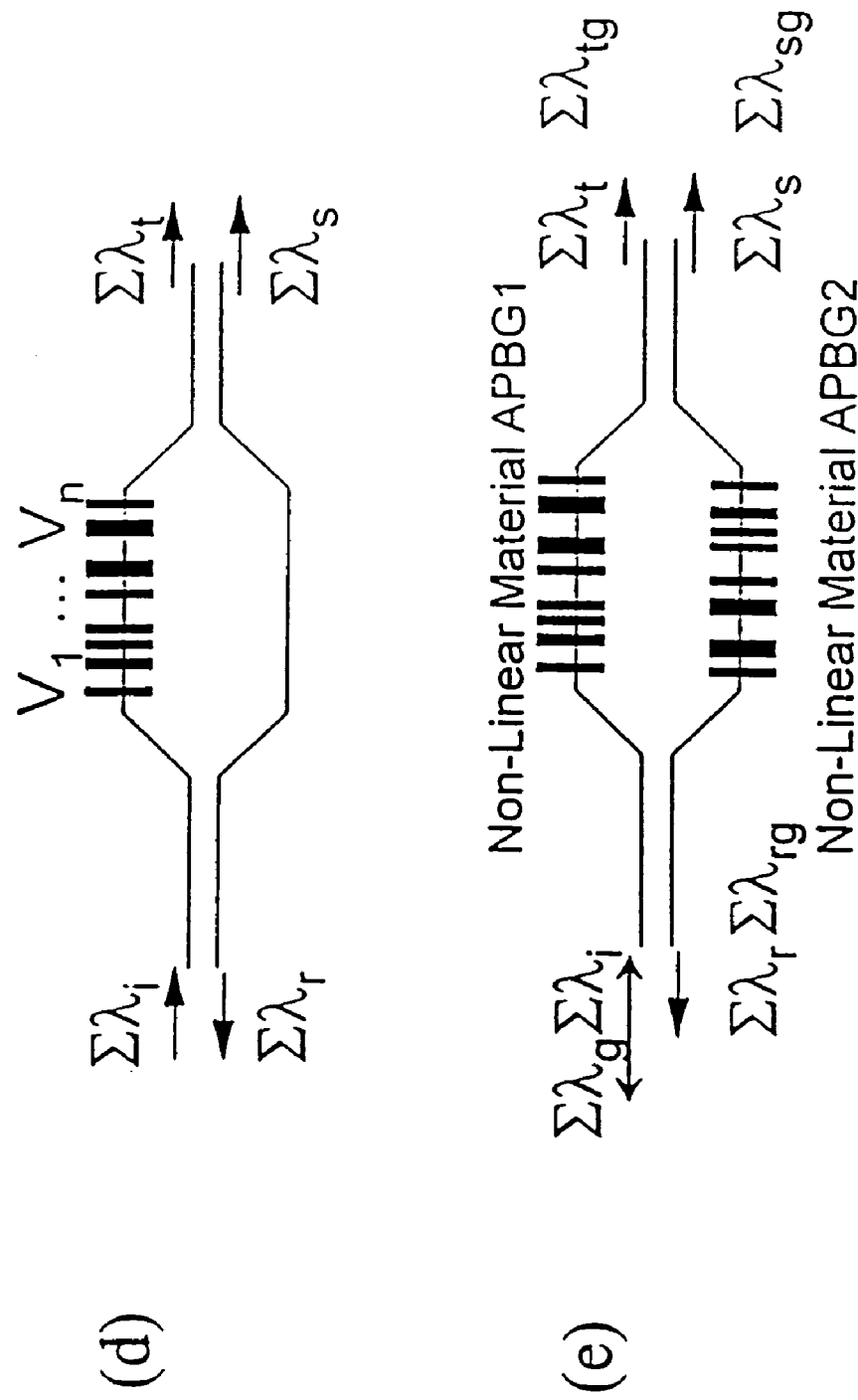
Figure 19:
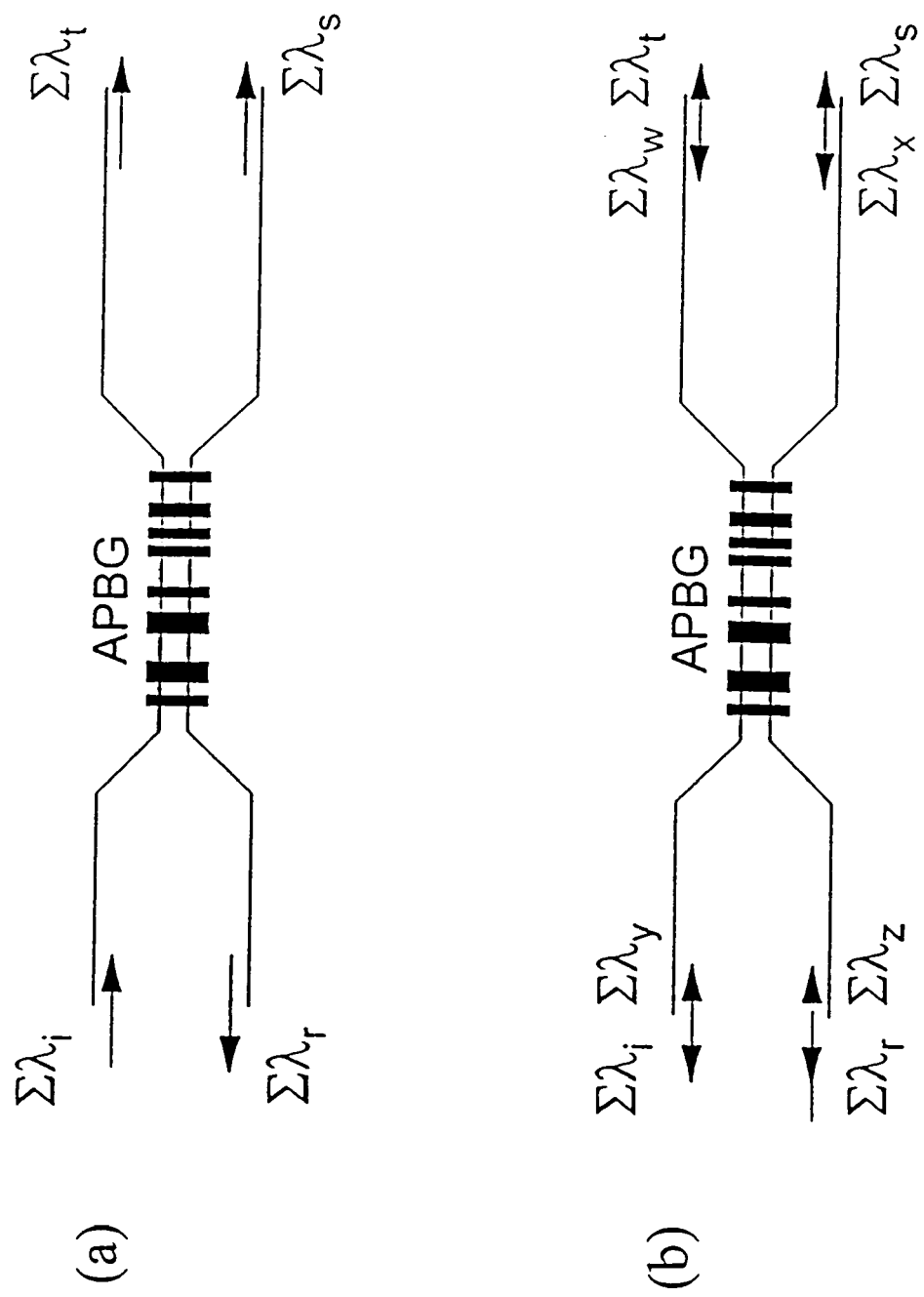
Figure 19:
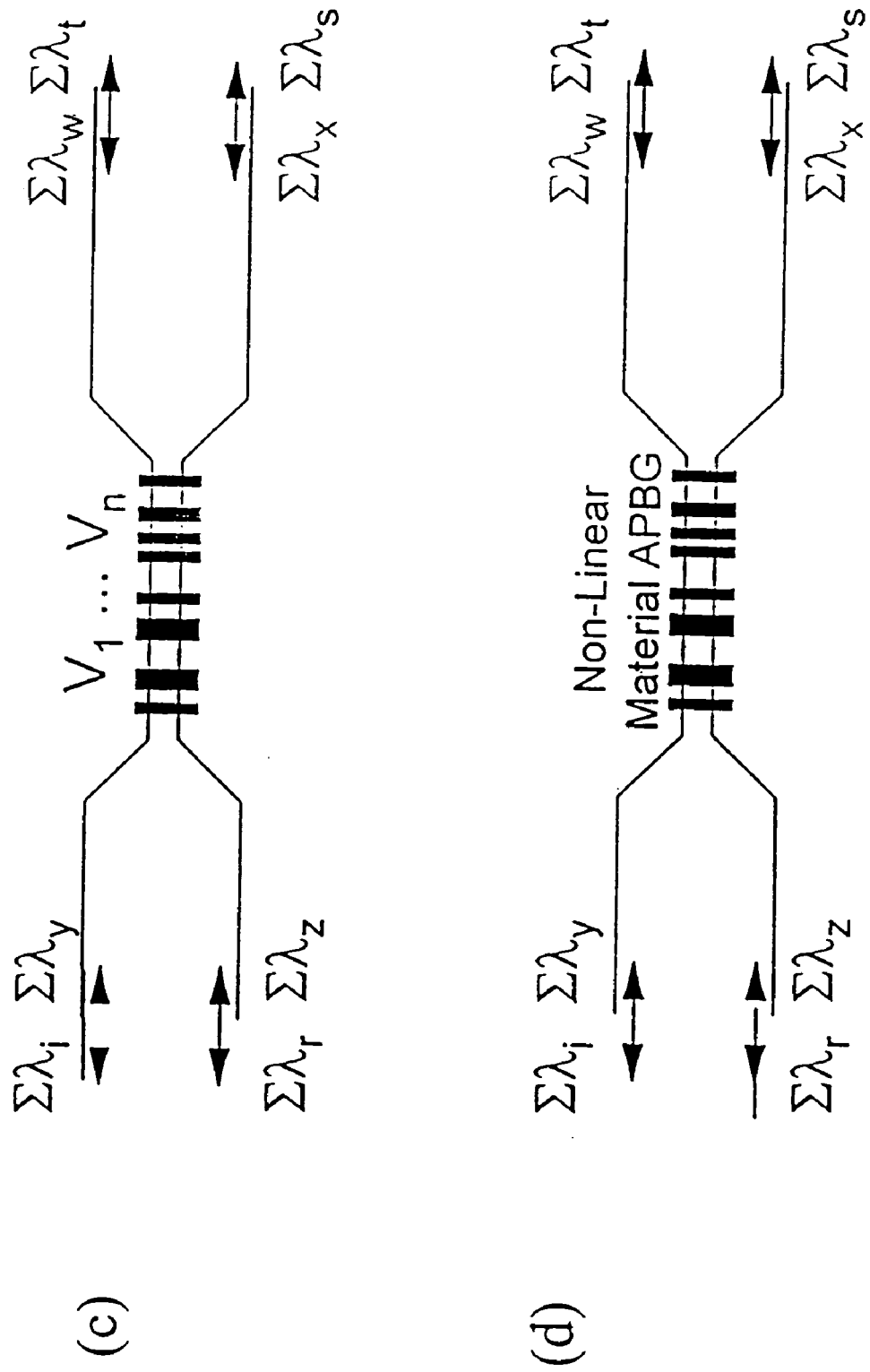
Figure 20:
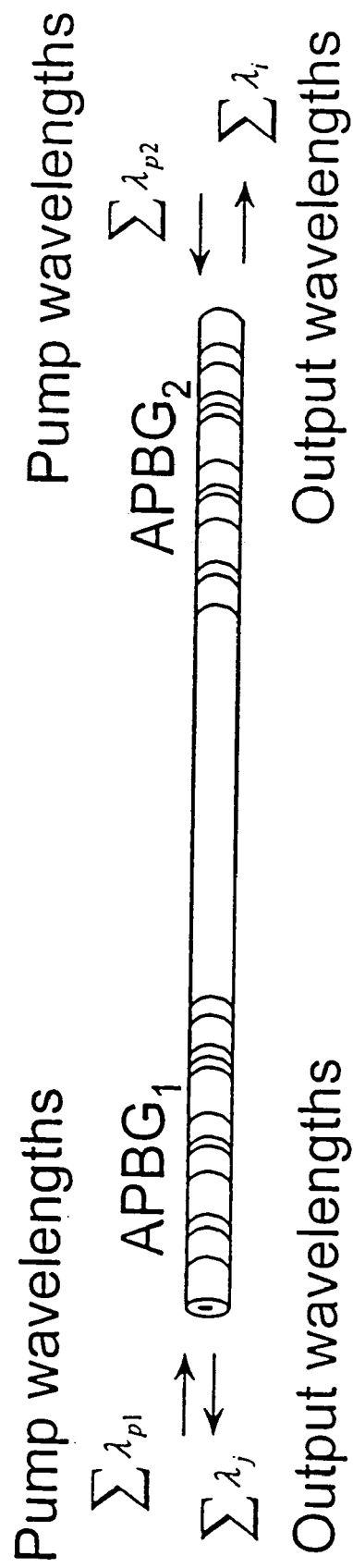
Figure 21:
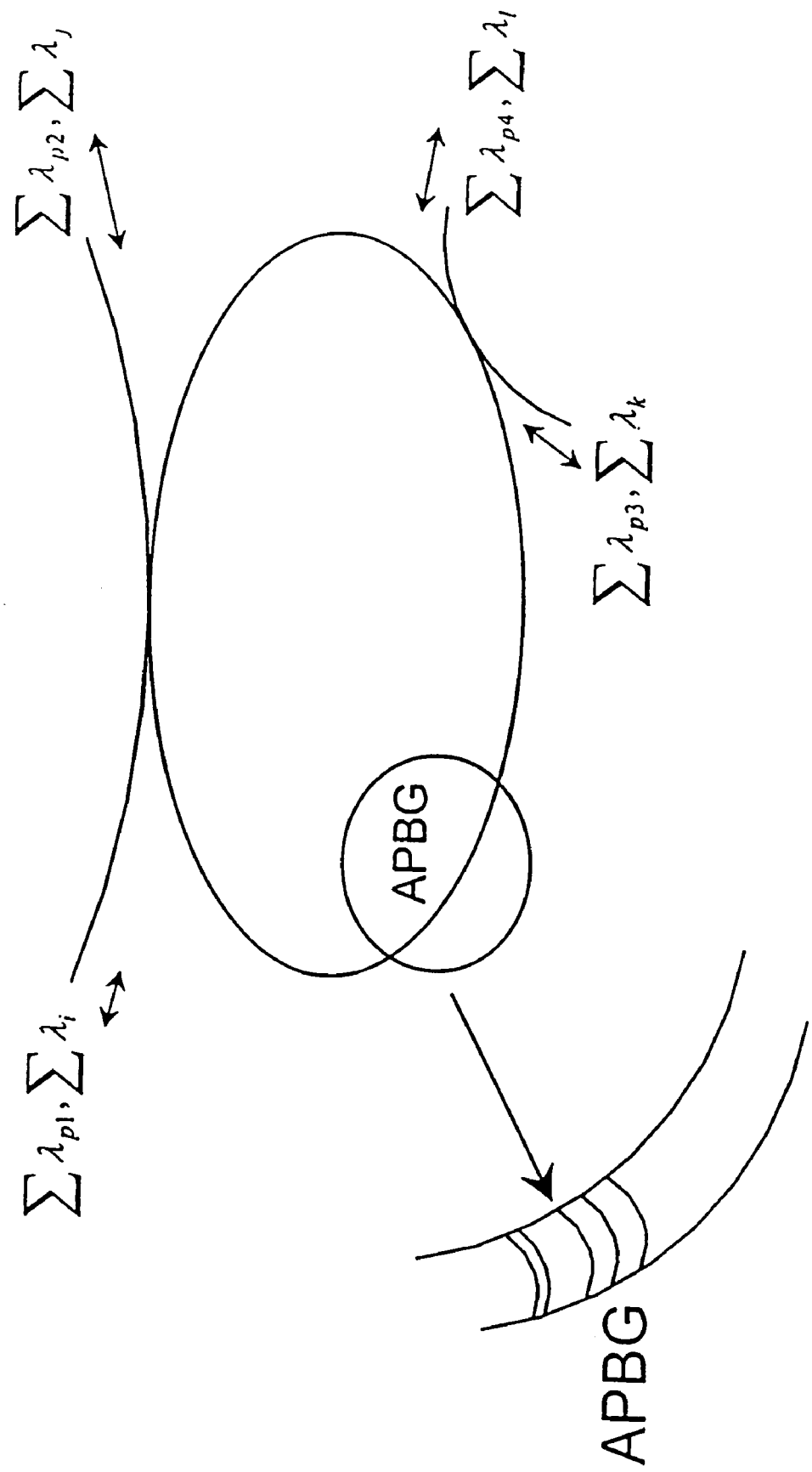
Figure 22:
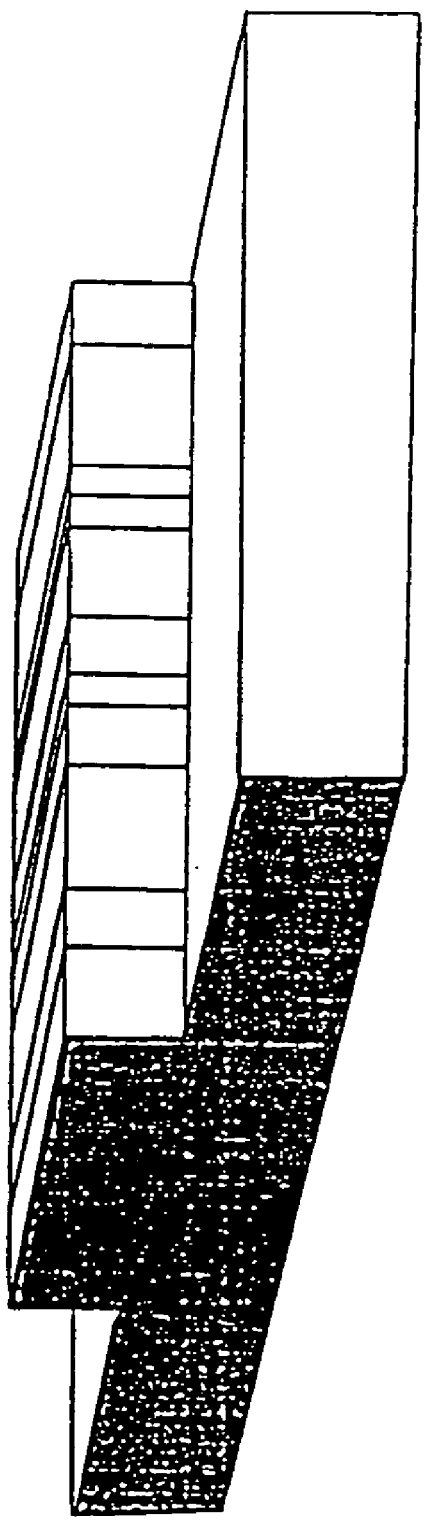
Figure 23:
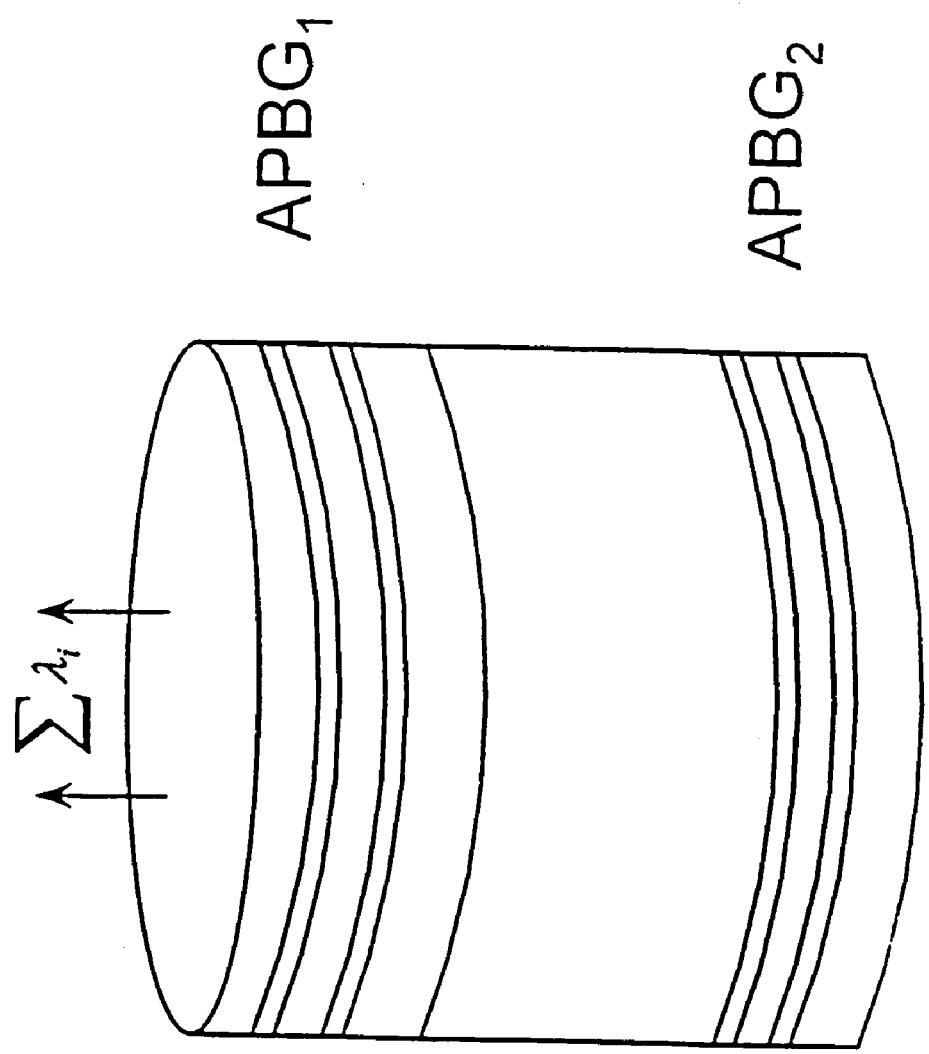

FIG. 18 shows an APBG within Mach-Zehnder configurations:
 (a) unidirectional
 (b) bidirectional
 (c) different APBG in each arm of MZ
 (d) programmable APBG within MZ
 (e) non-linear material APBG within MZ, with generated frequencies FIG. 19 shows aperiodic-grating assisted couplers:
 (a) uni-directional, passive coupling
 (b) bidirectional, passive coupling
 (c) programmable coupling
 (d) non-linear material APBG within coupler, with generated frequencies FIG. 20 shows a (asymmetric) Fabry-Perot style cavity fibre laser;

FIG. 21 shows a generic fibre ring laser;

FIG. 22 shows a distributed feedback semiconductor laser diode, employing one or more APBG structures in place of regular Bragg grating reflectors;

FIG. 23 shows a VCSEL employing one or more APBG dielectric stacks; and

Figure 24:
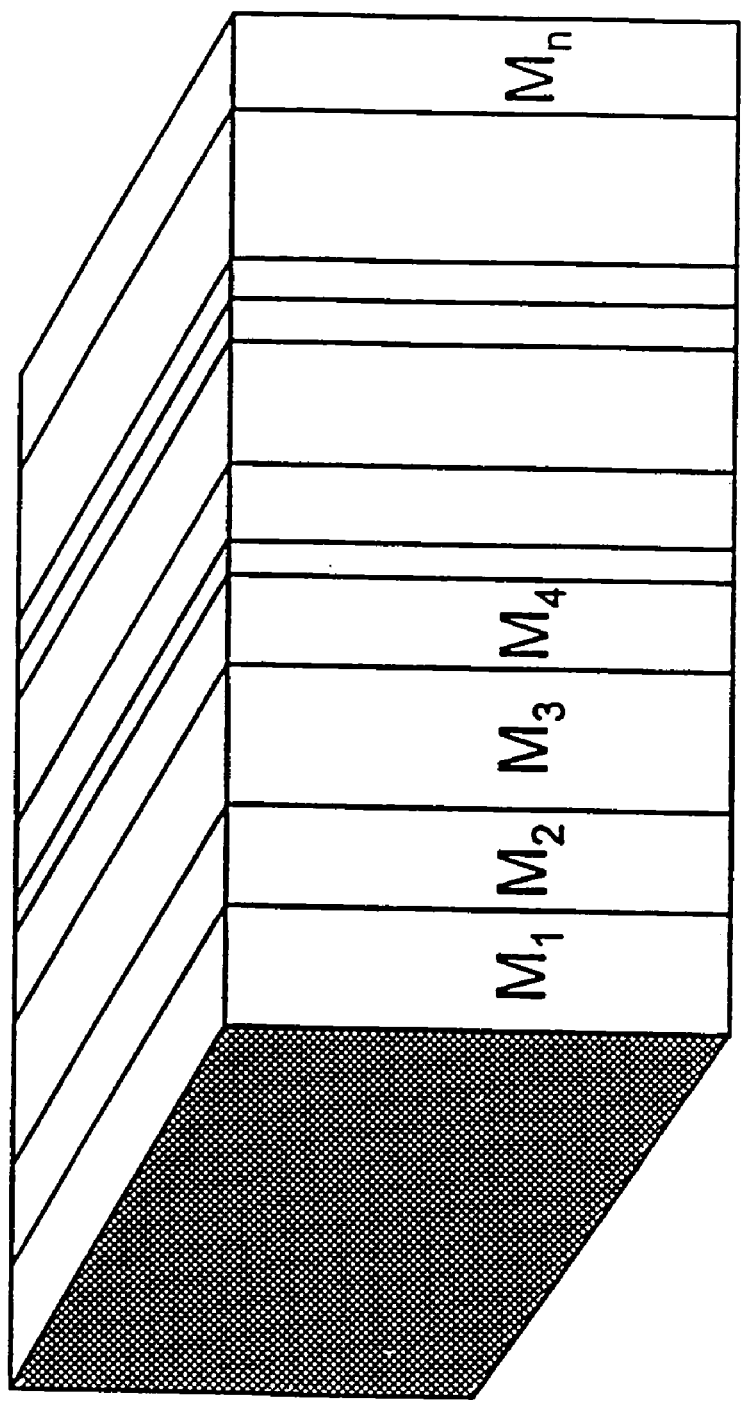

FIG. 24 shows a generic APBG lattice or superlattice having different atomic/molecular layers or multi-layers We have performed an experiment at microwave frequencies, rather than optical frequencies, since that is simpler. A microwave source was used, tuneable from 2 Ghz to 4 GHz; hence with wavelengths varying from 150 mm to 75 mm respectively in free space. The length of the binary APBG was close to 325 mm, and perspex (refractive index $n_2$=1.37) was used to cause the perturbation in refractive index, and hence backward coupling. Basic units consisting of an 18.8 mm length of air (refractive index, $n_1$=1) and an associated 13.7 mm (~18.8 mm/$n_2$) length of Perspex were used to construct the APBGs. Each basic unit was thus of the same optical path length.

Taken together, the smallest spatial period in a grating could thus be a base cell of length 32.5 mm, consisting of a unit length of air and a unit length of Perspex. That base cell could then be repeated 10 times within the 325 mm length of the transmission line, as shown in FIG. 1a.

A spatial period $\Lambda$ will reflect wavelengths given by $$\Lambda = (2m - 1)\frac{\lambda}{2},$$

where m is the grating order, given by m=1 in this case. However, the grating was made of materials with very different refractive indices and so that formula could not be used directly. Rather, it was necessary to consider the spatial period $\Lambda'$, given in terms of optical path length; i.e., as if both materials had the same refractive index (but still had the same reflection at their interface). In that case, (assuming $n_1=n_2=1$), $\Lambda'=2\times18.8$ mm=37.6 mm. The wavelength of maximum reflection (and hence minimum transmission) was thus be $\lambda=2\Lambda'=75.2$ mm, corresponding to a bandgap frequency of $f=c/\lambda=4.0$ GHz.

The next available regular grating, using the same sized base cells would have a spatial period of $\Lambda'=75.2$ mm (as shown in FIG. 1f), and would tend to have an associated bandgap frequency of 2.0 GHz. Generally it would not be possible to tune to intermediate frequencies between 2.0 Ghz to 4.0 GHz using the same dimensioned base cells. However, an aperiodic grating does allow this to happen, and the gratings for these intermediate frequencies are shown in FIGS. 1(b)–1(e).

It will be noted that (a) is periodic; (b) contains regular region corresponding to granting (a) i.e. it has a repeated unit one mark and one space; (c) is periodic and again has the regular one mark and one space unit repeated; (d) is an aperiodic APGB; (e) is an APGB comprising a concatenation of two identical APGB gratings which are each longer than the wavelengths filtered, (f) is a regular grating of twice the period of (a).

It will be noted that gratings (b), (c), and (e) display some periodicity of a longer period than the period of the regular gratings (a) and (e). Grating (b) comprises two concatenated gratings of form (a); grating (c) has a period of 5 elements; and grating (e) has a period of 10 elements. Gratings (b) and (c) are thus not fast-varying aperiodic gratings according to our definition. Note, however, that the grating of (e) is, in fact, two concatenated aperiodic gratings.

Figure 1:
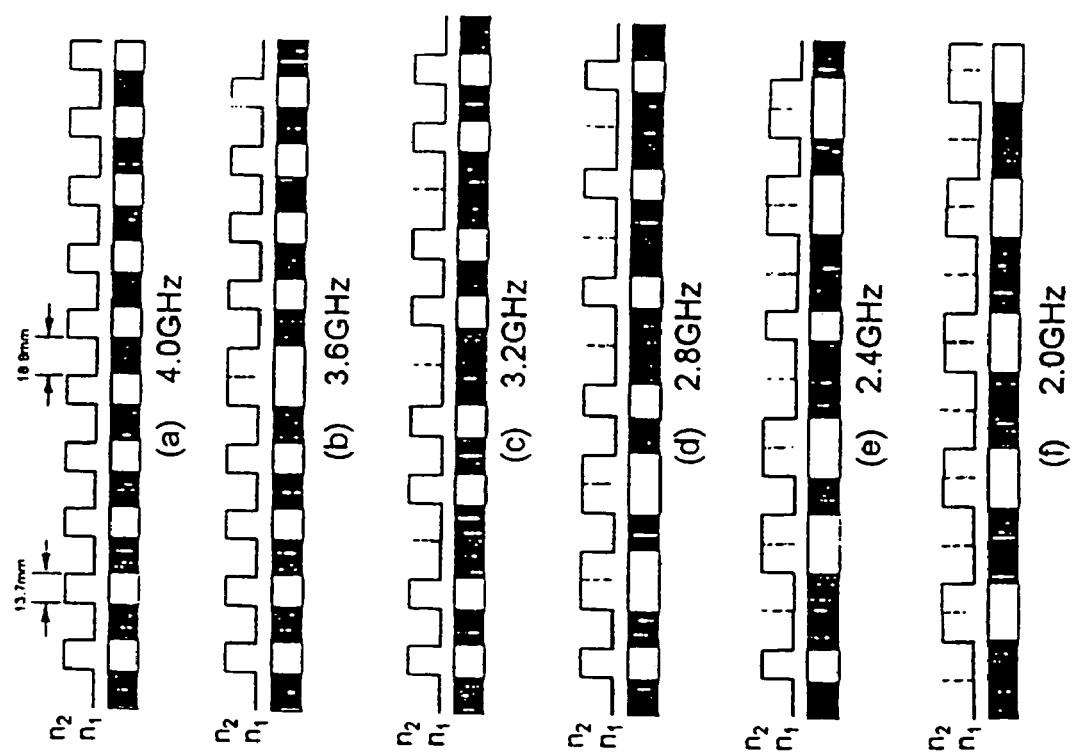
FIG. 1 shows ((a) to (f)) structures of gratings having various single bandgap frequencies.

The reason that a high proportion of the gratings generated in the calculation of FIG. 1 have some degree of periodicity is that the grating consists of only 20 elements, making it likely that those elements will display some periodicity. Larger sets of grating elements will have useful combinations which do not this tendency.

Figure 2:
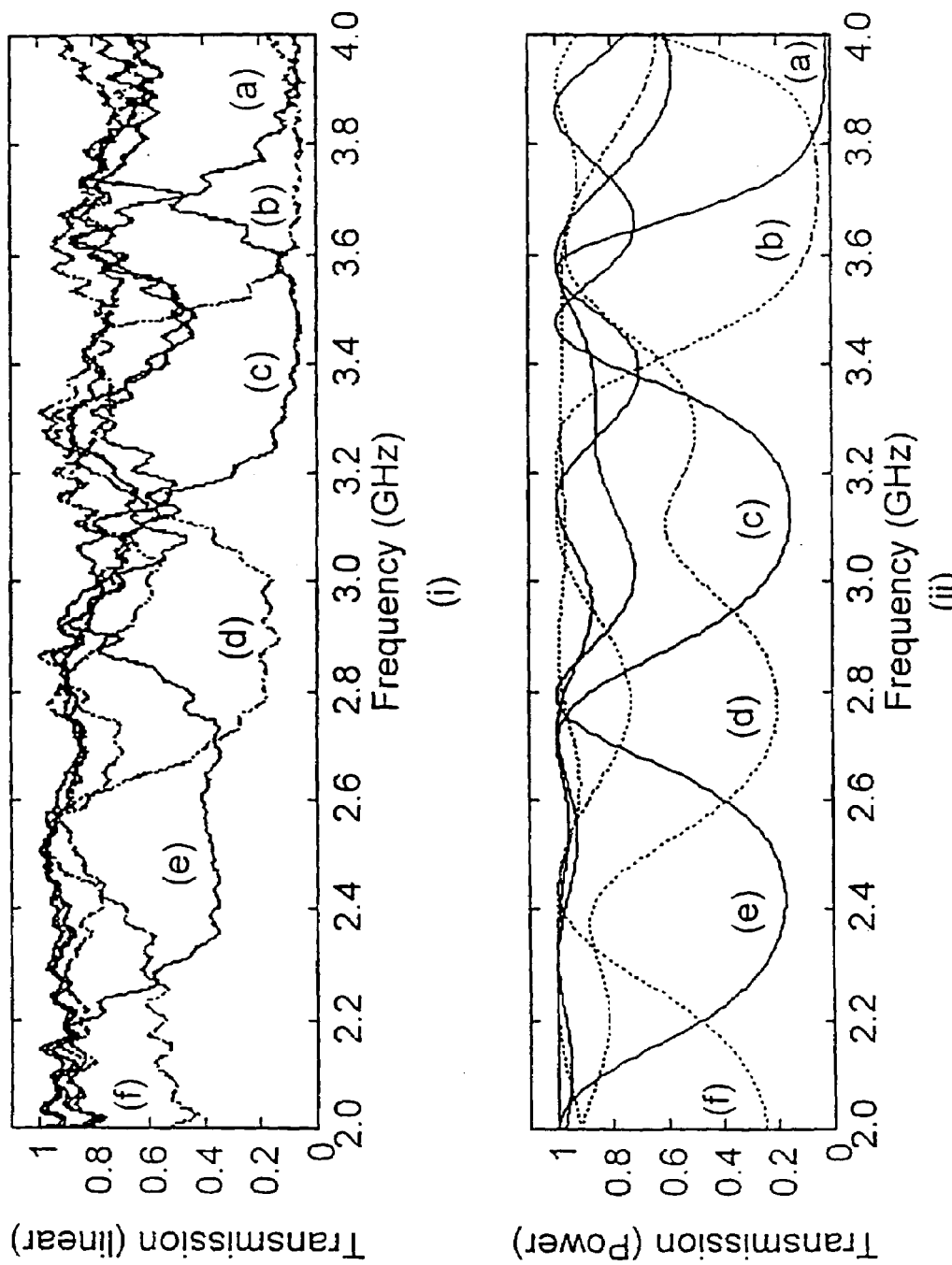
FIG. 2 shows (i) experimental and (ii) theoretical (from Fourier Transform theory) single bandgap spectra for APBGs of FIGS. 1a to 1f.

FIG. 2(i) depicts the measured transmission spectra of the APBG structures depicted in FIGS. 1a–1f. Curves (a) and (f) show the transmission spectra for the regular gratings of effective spatial period 37.6 mm and 75.2 mm respectively. The bandgap of curve (a) in FIG. 2(i) is very well defined, with a centre frequency of about 4.0 GHz, with the bandgap centre frequency of curve (f) predictably being at 2.0 GHz, but less well defined as might be expected for a grating with only half the number of periods. Curves (b)–(e) show the bandgap being shifted in incremental steps of about 0.4 GHz, between 4.0 GHz and 2.0 Ghz, by using more highly structured Bragg gratings. Curve (b) has a bandgap centre frequency of 3.8 GHz, while (c) is at 3.4 GHz, (d) is at about 2.9 GHz, and curve (e) is at about 2.6 GHz, agreeing well with the theoretical bandgap frequencies as depicted in FIG. 2(ii). The strength of the bandgap for more highly structured Bragg gratings is not as large as for a regular Bragg grating, so that the transmission at the bandgap centre frequency tends to be higher. A longer APBG with more segments would ensure a stronger bandgap. There is also a tendency for the bandgap to weaken at lower frequencies, which also agrees with the theoretical prediction.

Figure 3:
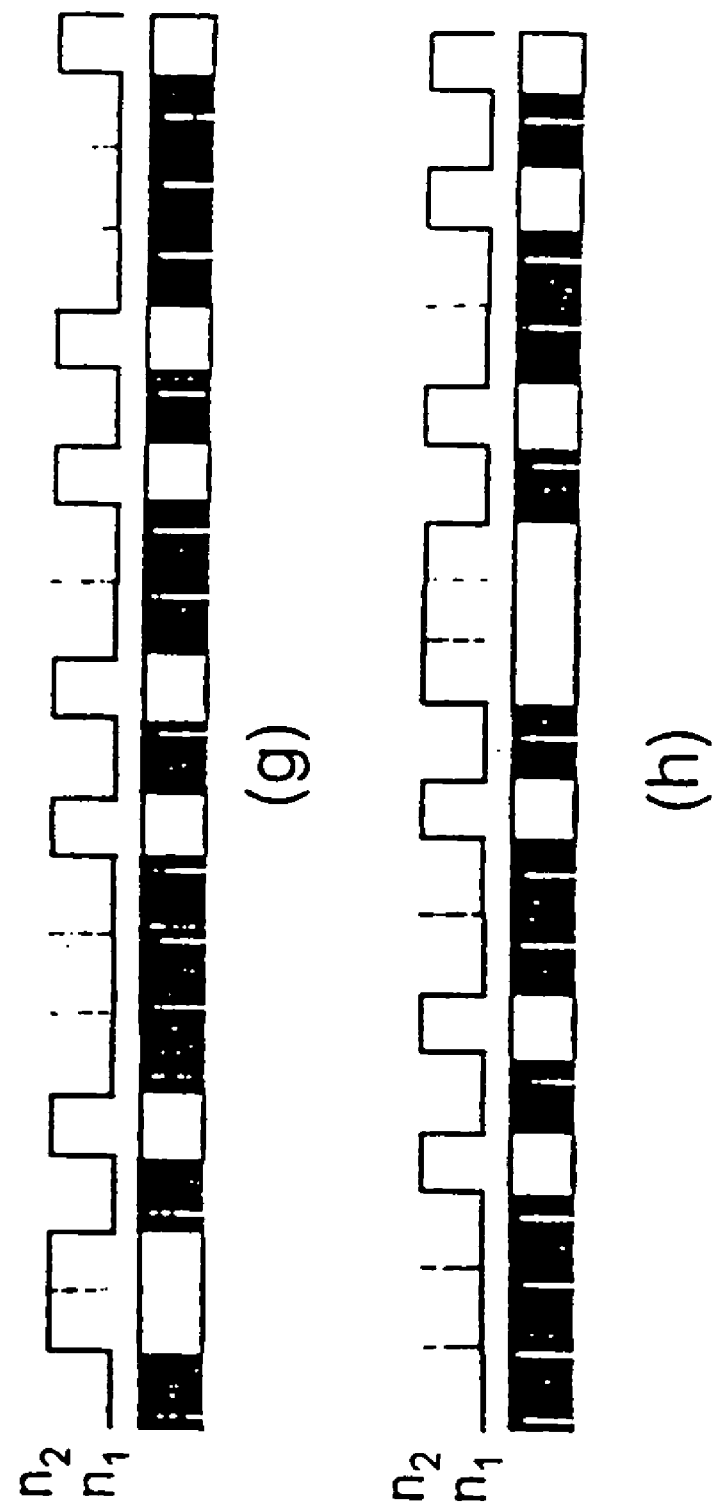
FIG. 3 shows examples of two APBGs ((g), (h)) designed to exhibit multiple bandgap functionality, at 2.8 GHz and 3.6 GHz.
Figure 4:
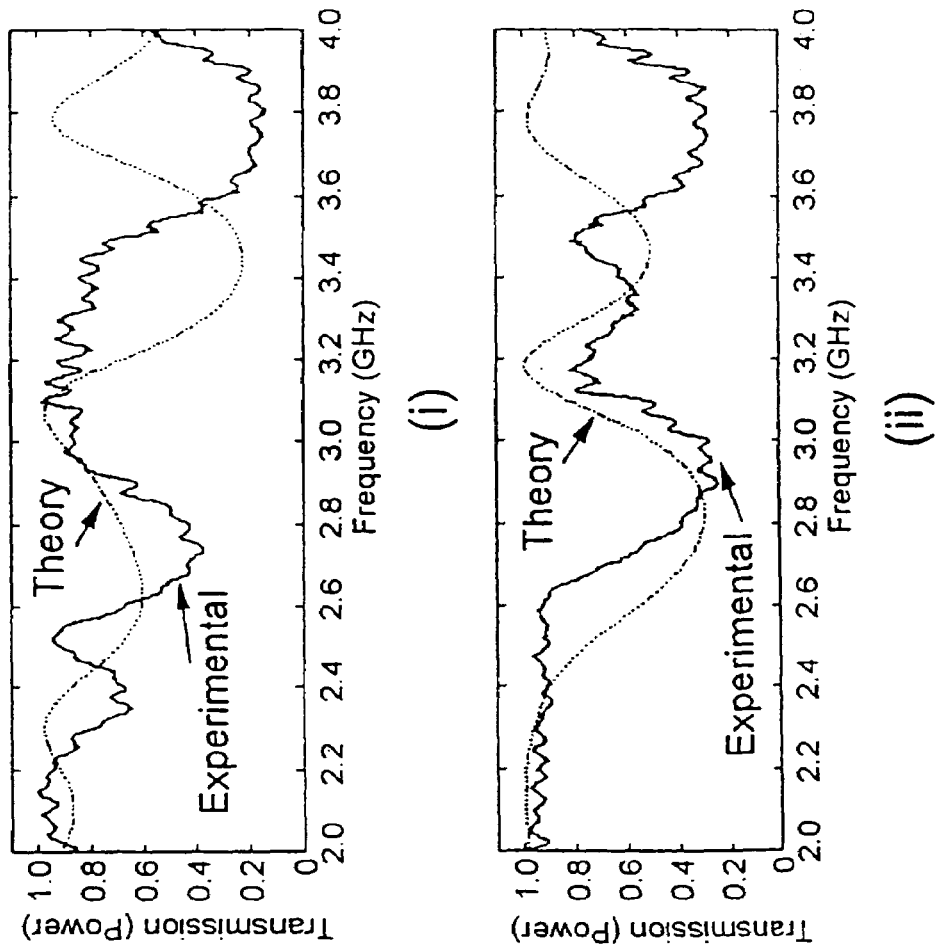
FIG. 4 shows experimental and theoretical results for (i) APBG (g) and (ii) APBG (h), exhibiting multiple bandgaps.

A Bragg grating can also be designed to exhibit multiple bandgaps. Examples of two such APBGs are shown in FIG. 3, and both have been designed to exhibit bandgaps at 2.8 GHz and 3.6 GHz. Each APBG has been designed to provide the same functionality, as afforded individually by the APBGs shown in FIGS. 1(b) and 1(d). The resulting transmission spectra for the two APBGs are depicted in FIG. 4, and show that the corresponding bandgap centre frequencies lie at about 2.8 GHz and 3.7 GHz, which while not exactly matching the designed bandgap frequencies of 2.8 GHz and 3.6 GHz, still shows close correspondence. Because the APBG is having to do more 'work', in the sense that it is trying to produce 2 bandgaps, rather than just one, the resulting bandgaps tend to be weaker than those shown in FIGS. 2b and 2d. There also appears to be additional 'parasitic' bandgaps at 2.4 GHz for APBG(g) and 3.4 GHz for APBG(h). Those are probably due to additional parasitic resonance between spatial components of the APBGs at those frequencies and the experimental waveguide apparatus. Of interest to note is that the two APBGs have been designed to ostensibly exhibit the same functionality (or transmission spectra), but the design process has yielded two completely different candidate APBGs. Both APBGs have the same primary spectral response (i.e. bandgaps at about the designed frequencies of 2.8 and 3.6 GHz), but each has slightly different parasitic properties. This illustrates the fact that the solution-space of APBGs is very large and contains many candidate functions, each with a similar Fourier Transform characteristic.

Figure 5:
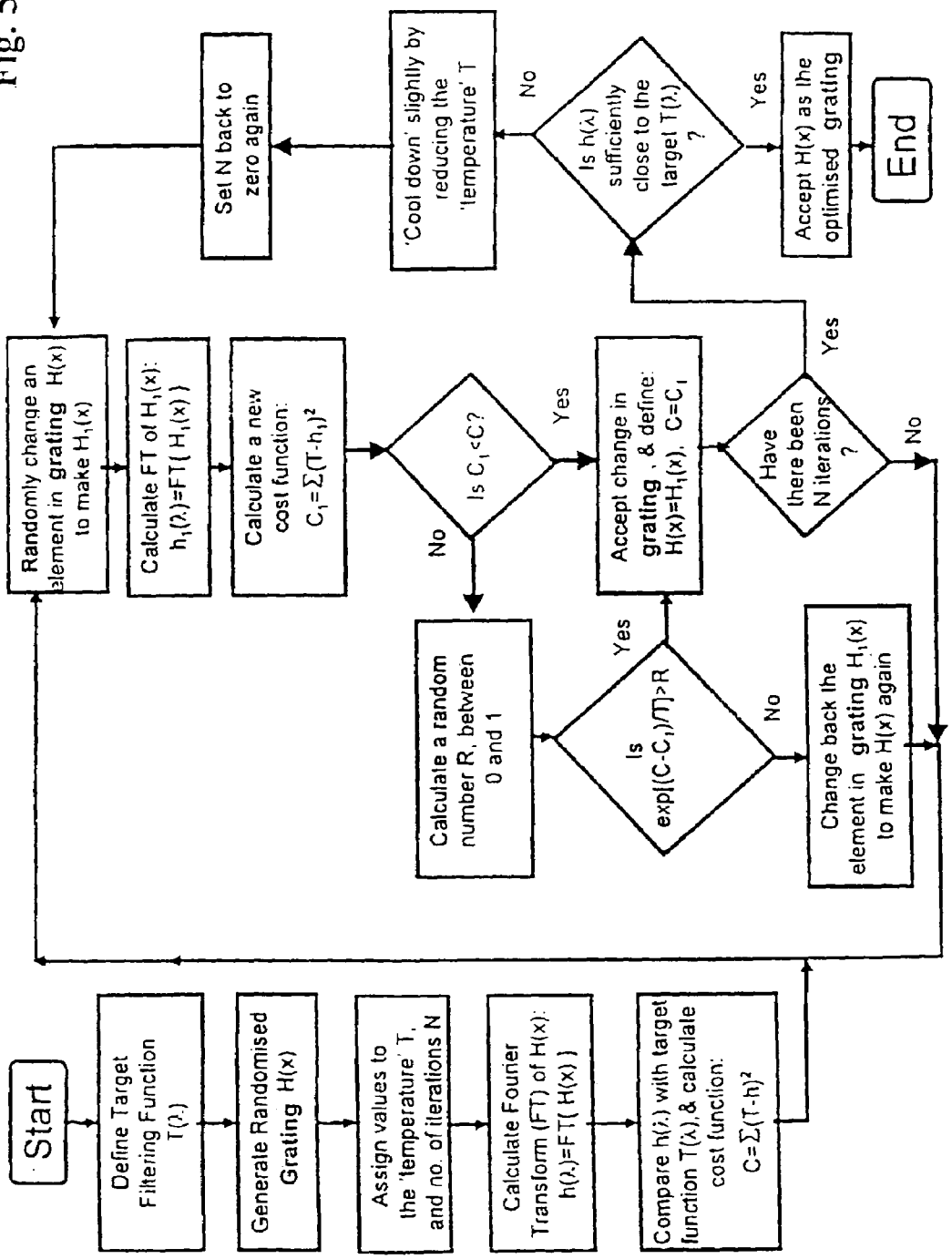
FIG. 5 is a flowchart illustrating the use of an optimisation algorithm (simulated annealing) to carry out the invention.

Use of an optimisation algorithm suitable for carrying out the invention is depicted schematically in FIG. 5. In this example, the optimisation algorithm is simulated annealing, which is a well-known optimisation algorithm.

Annealing is a process in which a material is strengthened by the smoothing out of dislocations in its structure. The material is heated up and then slowly cooled down. The heating causes atoms forming dislocations in the material to be excited out of local potential energy minima; cooling down slowly causes them to be redistributed smoothly, with minimal dislocations. If the cooling is too fast, dislocations will be "frozen" into the material.

Simulated annealing mimics the annealing process. A cost-function takes the place of potential energy. The aim of the process is to locate a global minimum in cost space, by randomly "hopping" solutions around (a "hot" system) and then gradually "cooling" the system by reducing the size of the random hops. If the cooling rate is chosen correctly, the solution will hopping into the global minimum whilst the system is hot and be kept there as the system cools.

The optimisation procedure depicted in FIG. 5 comprises the following steps:

(a) the target filtering function $T(\lambda)$ is selected;

(b) a random grating structure $H(x)$ is generated;

(c) a value is assigned to the initial "temperature" T of the simulated annealing, the rate of cooling alpha and the number of iterations N is set;

(d) the Fourier Transform (FT) of the grating structure is calculated, giving $h(\lambda)=FT[H(x)]$;

(e) the FT of the grating structure is compared with the target function, by calculation of the cost function (i.e., $C=\Sigma(T-h)^2$);

(f) an element in the grating is randomly changed to make a new grating, $H_1(x)$;

(g) the FT of the new grating is calculated, giving $h_1(\lambda)=FT[H_1(x)]$;

(h) a cost function is calculated for the new grating (i.e., $C_1=\Sigma(T-h_1)^2$)

(i) the cost function for the new grating is compared with the cost function for the previous grating:

(1) if $C_1 < C$, then the new grating is accepted and H(x) is redefined (i.e., $H(x) = H_1(x)$ and $C = C_1$);

(2) if $C_1 >= C$, then a random number R between 0 and 1 is calculated; if $\exp[(C-C_1)/T] > R$ then the new grating is accepted and H(x) is redefined (i.e., $H(x) = H_1(x)$ and $C = C_1$); otherwise the new grating $H_1$ is abandoned and the changed element is returned to its previous state—another random change is made to the grating and steps (f) to (i) are repeated;

(j) once a new grating has been accepted, if the number of iterations which have taken place has not yet reached N, another random change is made to the grating and steps (f) to (i) are repeated;

(k) if the FT of the grating $h(\lambda)$ is sufficiently close to the target function $T(\lambda)$, the grating is accepted as having been optimised; otherwise, the simulated annealing is "cooled down" slightly, by reducing the temperature T by the factor alpha, and the iteration count is set back to zero. The rate of cooling alpha is usually ket constant througout the annealing. If after further loops there is no change in $h(\lambda)$ i.e. the temperature is now too cold for further change) the process is stopped (not illustrated).

In the case of calculating a grating structure for filtering light the target function is the reflectivity spectrum and the Fourier transform of grating structure performed in the simulated annealing is in detail as follows:

$$\rho(\beta) \approx \tanh\left\{\left|\frac{1}{4\bar{n}^2}\int_{-\infty}^{\infty}\frac{\partial \varepsilon_r(z)}{\partial z}e^{j2\beta z}dz\right|\right\}$$

Where $\rho(\beta)$ is the reflectivity spectrum, $\bar{n}$ is the average refractive index, $\varepsilon_r(z)$ is the relative permittivity distribution, $$\beta = \frac{\bar{n}2\pi}{\lambda}$$

is the propagation constant, and z is the spatial coordinate.

The spatial derivative of the relative permittivity is integrated because it is changes in that which scatters light; the tanh function scales the result of the integration appropriately.

In the following pages we shall describe the large variety of applications where APBG structures can be employed. For clarity we have divided the applications into four main areas: filters and related devices for free-space and guided electromagnetic waves including integrated optics; non-linear applications including optical signal processing; laser (maser) configurations; and more general "band engineering" of solid state devices. It should be emphasised that APBG structures can be both 2D and 3D in nature, although many of the applications highlighted tend to only require 1D APBG structures. A 1D APBG structure is one in which light emanating from a point sees the structure in one direction (along a line). A 2D APBG structure is one in which light emanating from a point sees the structure in all directions in a plane. A 3D APBG structure is one in which light emanating from a point sees the structure in all directions in a plane. A 3D APBG structure is one in which light emanating from a point sees the structure in all directions in space. "Seeing" the structure means that the light is affected by the structure in its direction of propagation. In wave guides, for example, the light has significant component of the wavevector across the guide as well as along and so in that sense is propagating across as well as along the guide.

Filters

Examples of Desired Filtering Characteristics

Figure 8C:
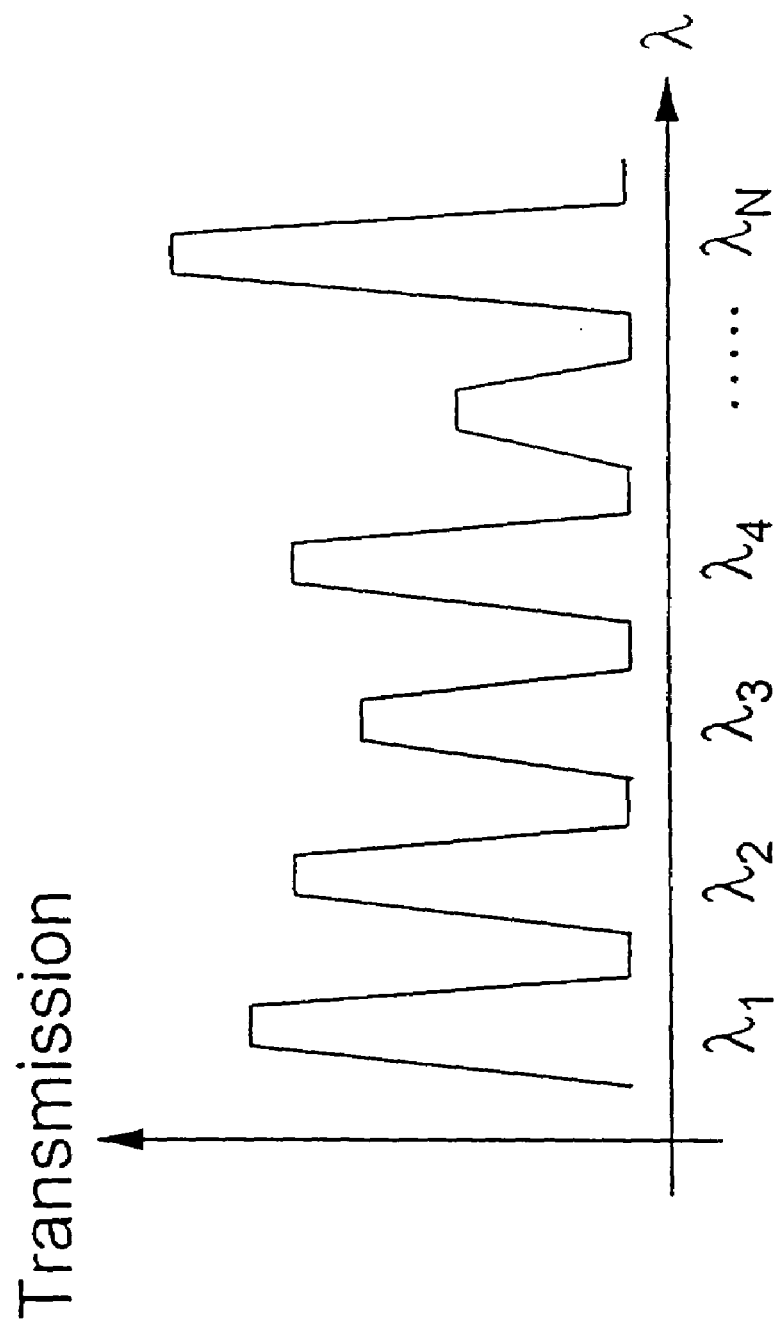

The use of APBGs allows tailored filter responses to be achieved in a far more flexible manner than allowed by existing periodic or "slowly-varying" filter structures. Examples of desired characteristics are: high-pass, band-pass, notch and low-pass filters (FIGS. 6(a)–(d)) with particular phase characteristics (e.g. linear-phase, nonlinear phase, phase compensation); apodised passbands and passband-flattened passbands (FIG. 7(a)–(b)); comb-like filters, segmented passbands and non-uniform response segmented passbands ((e.g. for power equalisation) (FIG. 8(a)–(c)); and single frequency and multiple frequency dispersion compensation (FIG. 9). With an appropriately sized (e.g. no. of elements) APBG, the filter can also be designed to exhibit appropriate combinations of such characteristics. Higher dimensioned (i.e. 2D and 3D) APBG structures, such as aperiodic photonic crystals, can be designed to exhibit similar useful filtering properties.

Dielectric Stacks

In general, quarter-wavelength dielectric stacks use integer multiples of $\lambda/4$ thickness elements, where $\lambda$ is the wavelength of interest to be filtered. However, we have discovered that we are not restricted to using integer multiples of $\lambda/4$ thickness, but we can design an APBG to have continuously-varying thicknesses of elements to achieve the desired filtering function. An APBG can be designed for a specific wavelength, where the unit thicknesses are not equivalent to $\lambda/4$ thicknesses, but are some other arbitrary thickness instead; see. gratings (b)–(e) of the embodiment/experiment description given above. Naturally, APBG dielectric stacks can also be designed for multiple wavelength filtering, see gratings (g) and (h).

Figure 10A:
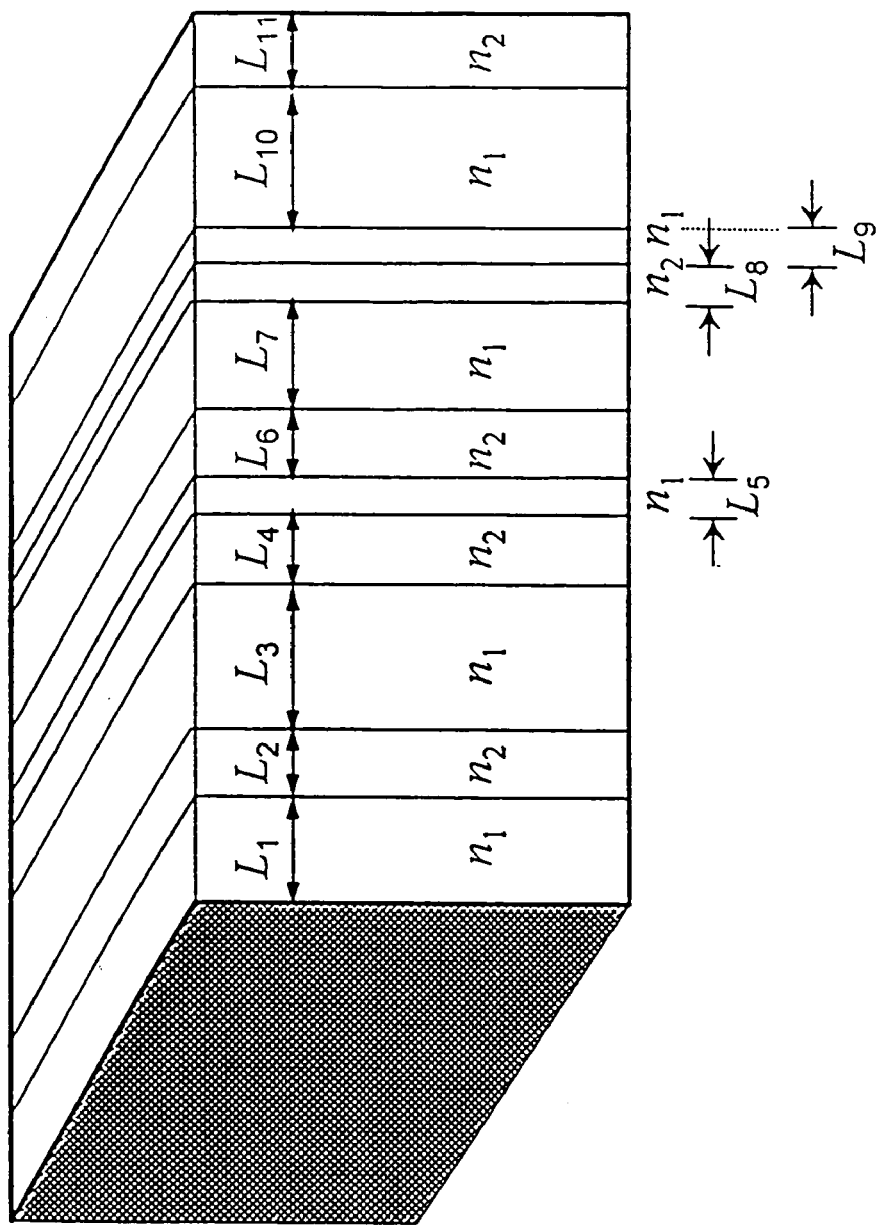
Figure 10B:
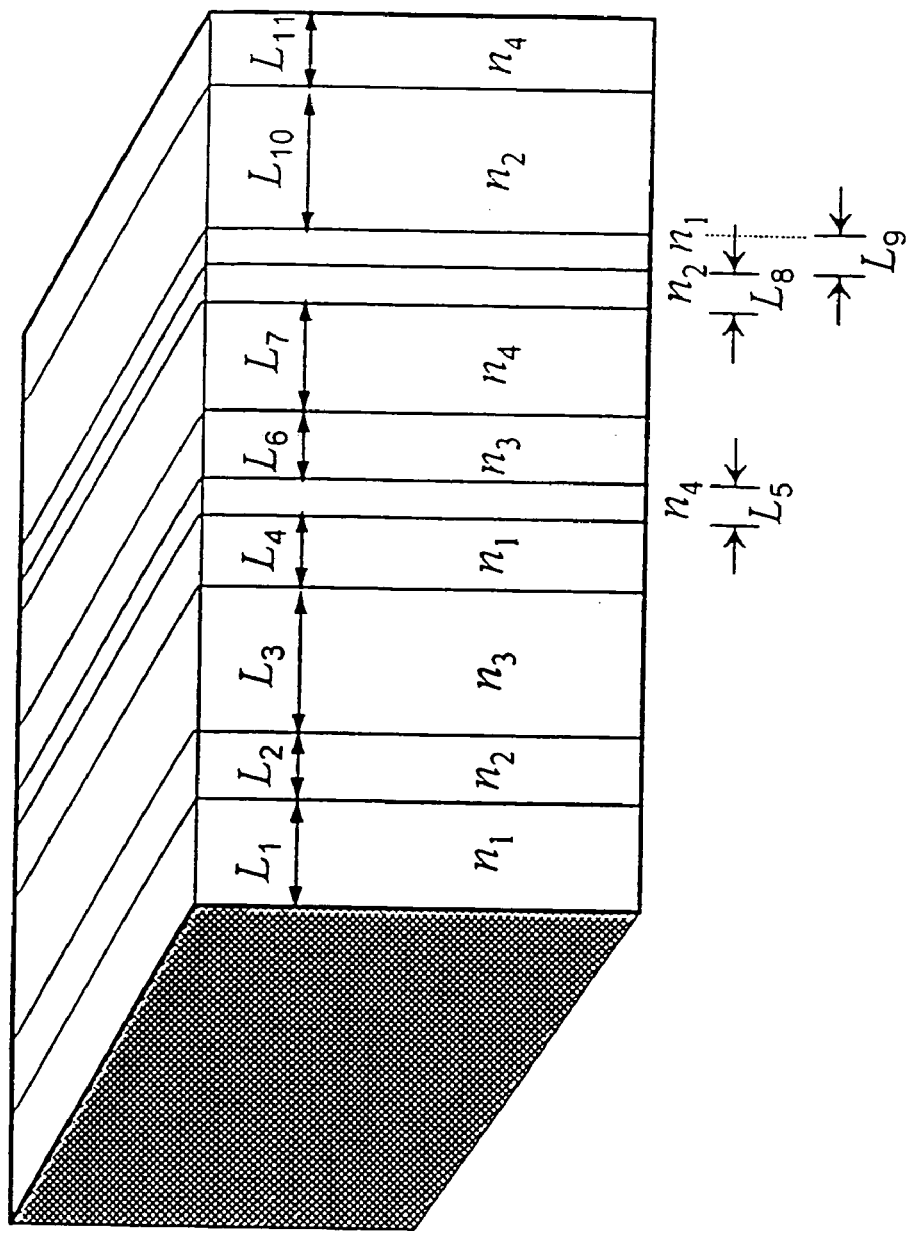
Figure 11:
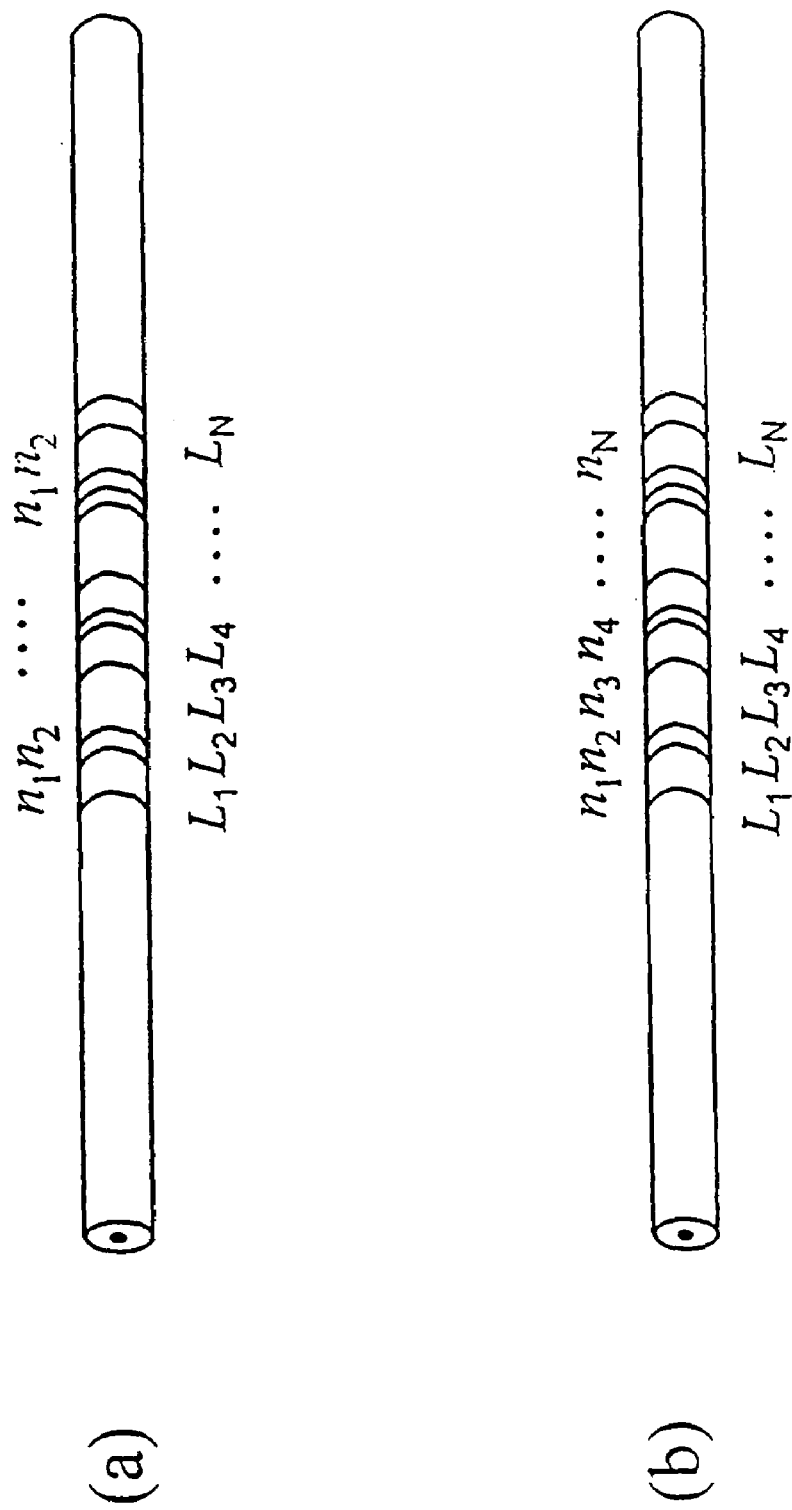

FIG. 10 shows two embodiments of APBG "dielectric stack" filters. The first (FIG. 10(a)) is a binary aperiodic dielectric stack where only two different refractive indices are stacked in an aperiodic fashion. FIG. 10(b) shows a more general APBG dielectric filter consisting of layers of various (more than two) refractive indices where the thickness and refractive index of each layer is designed to yield the overall required filter characteristic.

Aperiodic Fibre Bragg Gratings

APBGs have many applications in guided-wave devices. Optical fibre Bragg-gratings FBGs have recently received considerable attention. The use of APBG structures, (which are by their nature "fast-varying" as opposed to the already demonstrated slowly-varying non-uniform Bragg gratings, such as chirped FBGs and apodised FBGs) permits tailoring of the filter response as described above, e.g. for multi-wavelength applications. An APBG structure can be written using UV light into the core and/or the cladding of the fibre, and can consist of either just a binary structure of two different refractive indices or an APBG of multiple refractive indices, as shown in FIGS. 11(a)–(b).

Waveguiding Structures

Waveguides can also have APBG structures incorporated in their design. The APBG structure is caused by some aperiodic disturbance in the permittivity or refractive index. This can be achieved by ribbed waveguide structures, where the effective refractive index is controlled by the height of the material (which may be a dielectric or a metal) above the waveguide. This can be either binary or multi-level in nature, as shown in FIGS. 12(a)–(b). Alternatively, different dopants or doping levels can be incorporated into waveguide or strip line to achieve the APBG structure in the refractive index, as shown in FIGS. 13(a)–(b).

The APBG structure can also be made dynamic/reconfigurable by causing the refractive index to change due to an applied voltage, via, for example, a thermo-optic or electro-optic effect. An inter-digitated set of electrodes, each controlled by an individual voltage can be placed upon the waveguide to create an APBG structure in the refractive index of the waveguide. The electrodes could be of different widths. The APBG structure could be binary if only 2 different voltages are applied across the ensemble of electrodes, or multi-level if variable voltages are applied to the electrodes, as depicted in FIG. 14(a). A shaped, comb-like electrode with variable thickness arms can be employed to create a fixed APBG structure, which can be turned on or off, or yield variable bandgap strengths, according to the single voltage applied to it. Such an arrangement is illustrated in FIG. 14(b).

Magnetic APBG Filter

The use of APBG filters to yield a desired response for an electrical-field is equally applicable for a magnetic-field. The same principle of operation applies. FIG. 15 depicts a binary APBG structure consisting of an array of dipoles, whose north and south poles are aligned to yield an aperiodic structure. An electromagnetic wave incident on the structure will be filtered according to the APBG designed transfer response.

Non-Linear Optical Applications

Aperiodically-Poled Non-Linear Materials (APNLMs)

Periodically-poled Lithium Niobate (PPLN) is now a well established method for enhancing the non-linear effect inherent to Lithium Niobate, via the technique of phase-matching. The grating induced by the periodic poling in the non-linear material acts as a photonic bandgap (PBG) for a small range of wavelengths centred on a 'signal' wavelength $\lambda_s$. A pump wavelength $\lambda_p$, also travels through the PPLN, but is not resonant with the PBG, so that it is not affected by it. The PBG effectively slows the signal wavelength $\lambda_s$, so that it travels through the material at the same speed as the pump wavelength $\lambda_p$, so keeping them in phase with each other. Thus they are (quasi-)phase-matched. Alternatively, $\lambda_p$ could be slowed. Since they do not drift apart from each other, there is a strong interaction between the pump and signal throughout the length of the PPLN, which enhances the non-linear interaction between them. The non-linear effects (such as $\chi^2$, $\chi^3$ non-linearities) will typically generate signals at additional wavelengths $\Sigma\lambda_g$, in processes such as 3- and 4-wave-mixing, or (e.g. $2^{nd}$ and $3^{rd}$)-harmonic generation. These non-linearities can be used to make optical parametric amplifiers (OPAs) and optical parametric oscillators (OPOs). There are other non-linearities such as the Kerr effect whose effect can also be enhanced using periodic-poling.

Aperiodic photonic bandgap structures can also be employed within non-linear materials to quasi-phase-match multiple wavelengths with each other, with multiple generated wavelengths, and with multiple pump wavelengths. Each of the wavelengths within an arbitrarily chosen set of wavelengths can be quasi-phase-matched with each other. Arbitrary, multiple sets of wavelengths can be adopted, and the APBG designed so that each set is essentially independent (i.e. non-phase-matched) with respect to the others.

Since the APBG can be designed to have bandgaps and bandpasses at arbitrary multiple wavelengths, it can be used to inhibit/suppress selected wavelengths, such as the pump wavelength(s), signal wavelength(s) and generated wavelengths. For example, An APBG structure might be used to enhance the 4-wave-mixing non-linear effect between a pump signal and various signal wavelengths, and to suppress the unwanted generated harmonics.

FIG. 16(a), shows an aperiodically-poled non-linear material, such as aperiodically-poled Lithium Niobate (APLN), with a set of pump wavelengths $\Sigma\lambda_p$, a set of input signal wavelengths $\Sigma\lambda_i$, and the various sets of wavelengths arising due to the APBG structure and the material non-linearities. There will be a set of output wavelengths $\Sigma\lambda_o$, e.g. modified or unmodified versions of the input/pump wavelengths; a set of generated (harmonic) wavelengths $\Sigma\lambda_g$, due to the material non-linearities; and a set of reflected wavelengths $\Sigma\lambda_r$, corresponding to input/pump/generated wavelengths which cannot propagate through the APBG and so are reflected back. The relative strengths of all the wavelengths can also be controlled by suitable design of the APBG. FIG. 16(b), shows how an aperiodially-poled non-linear material may be used in a 'bi-directional' manner, as opposed to the 'uni-directional' manner of FIG. 16(a). Applications include (multi-)wavelength conversion, optical (multi-)wavelength regeneration, optical (multi-)wavelength signal re-timing.

Multi-Wavelength, Optical Time Domain Signal Processing

Single wavelength, high-speed, optical time domain processing is now well established using the TOAD, a non-linear optical loop mirror (NOLM) containing a spatially asymmetric semiconductor optical amplifier (SOA). An input signal pulse is split into two equal components within the NOLM, and travel counterwise to each other. In the absence of any perturbing influence, by the principle of reciprocity, they will remain in phase with each other and interfere positively at the coupler, to emerge from the input arm of the NOLM as if it had been reflected. However, when a pump (switching) signal pulse is injected into the NOLM from the side, it causes the non-linear Kerr effect to induce a relative phase change in one of the components of the signal, but not the other component. This is due to the spatial asymmetry of the SOA. If the phase change is carefully controlled, the two signal components will interfere destructively at the coupler, and emerge from the alternative arm of the NOLM as a transmitted signal.

Introducing an APBG structure within the NOLM allows multi-wavelength optical time domain signal processing. FIG. 17(a) shows a TOAD structure with a spatially-asymmetric (determined by the displacement from symmetry, $d_1$) aperiodically-poled SOA acting as an APBG with amplification properties. At its simplest, the configuration will only allow certain switching wavelengths to pass through the SOA, to cause switching of the input signal pulse. Other wavelengths will be simply reflected. This introduces an element of wavelength selectivity within the TOAD, so that only certain wavelengths can be used to switch the signal.

Alternatively, the APBG structure can be used to reflect the input signal pulse components, so that they are reflected back to the coupler, rather than travelling all the way around the NOLM. At best, the APBG structure is placed spatially-symmetrically within the TOAD, as shown in FIG. 17(b), where the displacement $d_2=0$. In such a fashion, only signals of certain wavelengths can be switched. Naturally, both relative displacements $d_2$ and $d_3$ of the APBG and SOA respectively are degrees of freedom which can be adjusted to enhance functionality. A combination of aperiodically-poled SOA and APBG (i.e. a combination of FIGS. 17(*a*) and 17(*b*)) can be employed to allow wavelength selectivity in both the switching and input signal pulses.

FIG. 17(*c*) shows a TOAD configuration employing an aperiodically-poled non-linear material (APNLM) in place of the SOA. FIG. 17(*d*) shows a TOAD configuration employing an APNLM in place of the SOA, in conjunction with a passive APBG structure, while FIG. 17(*e*) shows 2 passive APBG structures within the NOLM. As is obvious from the discussion on APNLMs, these systems have many degrees of freedom, in terms of input, switching/pump, generated, output wavelengths, and the relative strengths of each of these. All of the configurations 17(*a–e*) can be used in combination with each other to achieve complex multi-wavelength optical time domain signal processing. All APBG structures depicted schematically in FIGS. 17(*a–e*) can either be separate components, or written directly into the optical fibre.

Mach-Zehnder Configurations

The Mach-Zehnder (MZ) interferometer is another important technology for optical switching, and APBGs also find application in it. FIG. 18(*a*) shows a simple MZ schematic, with an APBG structure placed within one of its arms. The APBG structure can be designed to change the relative phase of wavelengths by slowing the wavelengths down, and/or to reflect the wavelengths. Without any phase changes or reflections, a wavelength would be split equally into the 2 arms of the MZ, and then constructively recombine at the far end to emerge from the 'bar' port. However, by introducing a suitable phase change (typically $\pi/2$) the wavelength will emerge from the other 'cross' port, and can be considered to have been switched. The APBG can be designed to cause various arbitrary wavelengths to experience the required $\pi/2$ phase change, and so be switched, while other wavelengths will remain un-switched. Likewise, the APBG can also be designed to reflect certain wavelengths and impart a relative phase change onto them, so that they emerge either from the original input port, or the alternative input port to the MZ. Other intermdiate phase-changes, and degrees of reflectivities will cause the wavelengths to appear at the 4 ports of the device with varying degrees of strength. FIG. 18(*b*) shows that such a configuration can also be used bi-directionally.

FIG. 18(*c*) shows a MZ configuration with an APBG in each arm. Each APBG can be identical, or different to achieve a differential-type filtering operation. FIG. 18(*d*) depicts a MZ with a programmable APBG in one of its arms. Each element of the programmable APBG can either be individually controlled, such as in FIG. 14(*a*), or controlled by a single voltage source as in FIG. 14(*b*). FIG. 18(*e*) shows a MZ configuration with an APNLM in the arms. Alternatively, there could be just one APNLM in each of the arms, with the second arm plain or containing a passive APBG.

The APBG/APNLM structures within the MZ configuration can either be discrete components, or written into the integrated-optic waveguides.

Grating Assisted Couplers

Phase-matching is used in grating assisted couplers to cause cross-coupling, and thus switching to occur. Conventionally, a uniform (periodic) grating is written between two closely separated waveguides, each with its own modes of propagation. The grating causes coupling to occur between the modes of the first waveguide with the modes of the second waveguide, and coupled mode theory (CMT) can be used to analyse how a mode (associated with a wavelength) in one waveguide can excite a mode (associated with the same wavelength) in the second waveguide. If the parameters of the system are correctly designed (e.g. the correct grating period of the uniform grating), the power associated with the mode (i.e. wavelength) in the first waveguide can be completely resonantly coupled into the second waveguide. Hence switching has occurred. Other wavelengths will not be resonant with the grating, and so will remain unswitched. Generally, a uniform grating will tend to resonantly-couple only one wavelength (as well as weakly coupling higher harmonics of the wavelength).

Aperiodic grating structures (i.e. APBG structures) can be employed instead of a uniform grating, to resonantly-couple multiple, arbitrary wavelengths. The APBG can be considered to consist of multiple spatial periods, each or which resonates with a wavelength to cause cross coupling. Such a configuration is shown in FIG. 19(*a*). The input wavelengths $\Sigma\lambda_i$ enter the aperiodic-grating assisted coupler, and certain wavelengths, corresponding to $\Sigma\lambda_s$ are resonantly cross-coupled into the other waveguide, and are switched. The remaining wavelengths $\Sigma\lambda_t$ remain within the $1^{st}$ waveguide are simply transmitted. In addition, the APBG can also act as a photonic bandgap structure to reflect certain wavelengths $\Sigma\lambda_r$ back to the input plane, i.e. they could be reflected back to the $1^{st}$ waveguide, or into the second waveguide.

FIG. 19(*b*) shows the aperiodic-grating assisted coupler used in a bidirectional manner. FIG. 19(*c*) illustrates that the APBG structure could be made programmable. FIG. 19(*d*) indicates that an aperiodically-poled non-linear material (APNLM) could also be used to perform grating-assisted coupling, while generating additional wavelengths in the process, which can be designed to emerge at any one of the 4 possible ports.

Lasers

APBGs have many applications in the field of lasers. One or more APBGs can be used to define wavelength selective mirrors, which in turn can be used to define single or composite wavelength-selective resonators. When used in conjunction with an active medium, greater control of single or multiple laser wavelengths should be achievable than with conventional mirrors. It should be possible to create such mirrors both in bulk material and in waveguiding structures, such as those used, for example, in semiconductor lasers and fibre lasers. The APBG can also be designed to function as a suitable filter in optically pumped lasers, e.g. to couple the pump wavelength(s) in and out of the cavity/active medium.

Where APBGs are used in a multi-wavelength laser, each wavelength can have the same effective cavity length (or round trip time). The group-velocity/phase characteristics of each wavelength can be tailored via the APBG to facilitate a/synchronous multi-wavelength modelocking, and to exclude other wavelengths from modelocking, so that they lase in a CW mode.

For example two APBGs can be used to create a Fabry-Perot style cavity for a fibre laser (FIG. 20), with the added functionality that the filter response can be arbitrarily designed (to be high transmission, for example) at single or multiple pump wavelengths and (to have a high-Q, for example) at single or multiple laser wavelengths. One topical application of such a device would be in (cascaded) Raman laser/amplifiers, where typically it is required to shift the pump laser(s) through a number of Stokes shifts by creating coupled Raman lasers at each Stokes shift. Current proposals include one having many fibre Bragg gratings, each with a characteristic reflectivity at one Stokes wavelength to create a composite cavity. With appropriately designed APBG structures the same functionality could be achieved with only two APBGs.

APBGs can also be advantageously used within other laser configurations, such as rings (single or multiple, Sagnac loops, figure of 8 loops, etc.) FIG. 21 depicts such a generic fibre ring laser cavity.

Semiconductor lasers widely employ grating-based wavelength selective feedback, for example in DBR, DFB and VCSEL designs. APBGs can usefully be employed to provide such feedback, with the added functionality as defined above. Examples of DFB and VCSEL structures incorporating ABPGs are shown in FIGS. 22 & 23 respectively. Further functionality can be achieved, e.g. multi-wavelength conversion, multi-wavelength 3R regeneration, by concatenating suitable APBG/APNLM structures with either conventional semiconductor lasers, or APBG-modified semiconductor lasers.

Electronic Band-Gap Engineering

One of the most striking realisations about the application of APBG structures is that they are useful in modifying electronic band-gap of "new" materials, designed to have an aperiodic lattice or superlattice. We anticipate that a host of new materials and new devices should result from the application of these structures. There is already much work on periodic superlattices, for example. The use of APBG superlattices enhances the possibilities for such designs. A generic APBG lattice (or super-lattice) is depicted in FIG. 24.

Plane-wave (Fourier) expansions of wavefunctions are often used in current theoretical models of solid-state structures. With iterative optimisation algorithms (as outlined above) to design aperiodic structures, material parameters, e.g. location of band minima, effective mass etc. can be tailored to yield new aperiodic materials with desirable band-structure characteristics. Other parameters such as conductivity, thermal conductivity and dielectric permittivity or magnetic permeability could also be designed into the material.

This design technique should also find applications in the fabrication of new superconducting materials in which, for example, some of the properties of boson-like Cooper-pairs can be treated in an analogous manner to photons in a photonic crystal.

The invention claimed is:

1. A configurable aperiodic grating device comprising:
   a plurality of grating elements having a characteristic attribute, said grating elements being arranged so as to produce an actual first spectral response of the aperiodic grating device that matches a desired first spectral response; and
   a plurality of actuating elements formed on said aperiodic grating device that generates the first spectral response, said plurality of actuating elements capable of altering the actual first spectral response to produce at least one second actual spectral response that matches a desired second spectral response.

2. The grating device of claim 1, wherein the characteristic attribute is a physical dimension of a grating element.

3. The grating device of claim 2, wherein the physical dimension is at least one of a width and a height of the grating element.

4. The grating device of claim 3, wherein the characteristic attribute is a spacing between adjacent grating elements.

5. The grating device of claim 1, wherein the actuating elements comprise electric contacts.

6. The grating device of claim 5, wherein the electric contacts are configured so as to receive an identical electric potential.

7. The grating device of claim 5, wherein the electric contacts are configured so as to receive a different electric potential.

8. The grating device of claim 1, wherein the characteristic attribute is a refractive index.

9. The grating device of claim 1, wherein the actuating elements comprise heating elements.

10. Optical waveguide device comprising:
    a waveguide layer adapted to propagate electromagnetic radiation; and
    a configurable aperiodic grating device disposed on said optical waveguide layer so as to interact with radiation propagating in the optical waveguide, said aperiodic grating device comprising:
       a plurality of grating elements having a characteristic attribute, said grating elements being arranged so as to produce an actual first spectral response of the aperiodic grating device that matches a desired first spectral response; and
       a plurality of actuating elements formed on said aperiodic grating device that generates the first spectral response, said plurality of actuating elements capable of altering the actual first spectral response to produce at least one second actual spectral response that matches a desired second spectral response.

11. The optical waveguide device of claim 10, wherein the actuating elements comprise electric contacts.

12. The optical waveguide device of claim 11, wherein the electric contacts are configured so as to receive an identical electric potential.

13. The optical waveguide device of claim 11, wherein the electric contacts are configured so as to receive a different electric potential.

14. The optical waveguide device of claim 11, wherein the electric contacts comprise an interdigitated electrode configuration.

15. The optical waveguide device of claim 10, wherein the characteristic attribute is a physical dimension of a grating element.

16. The optical waveguide device of claim 10, wherein the physical dimension is at least one of a width and a height of the grating element.

17. The optical waveguide device of claim 10, wherein the characteristic attribute is a refractive index.

18. The optical waveguide device of claim 10, wherein the characteristic attribute is a spacing between adjacent grating elements.

19. The optical waveguide device of claim 11, wherein the electric contacts comprise a comb-like electrode configuration.

20. The optical waveguide device of claim 10, wherein the plurality of grating elements extend transversely to a longitudinal direction of the waveguide layer.

21. The optical waveguide device of claim 10, wherein the plurality of grating elements is embedded in the waveguide layer.

22. The optical waveguide device of claim 10, wherein the waveguide layer is selected from the group consisting of an optical fiber, a microwave strip element, a silica-on-silicon (SOS) planar lightwave circuit (PLC), a silicon-on-silica PLC, a semiconductor amplifier, and a semiconductor laser.

23. Method of producing a configurable aperiodic grating device having a plurality of grating elements, comprising:
- defining a cost function representing a goodness of fit between a desired spectral response and an actual spectral response of the grating device;
- defining a desired first spectral response of the grating device;
- assigning to each grating element of the grating device at least one characteristic attribute;
- generating an initial arrangement of the grating elements;
- iteratively modifying at least one characteristic attribute of at least one of the grating elements and computing for each iteration a first cost function;
- if the computed first cost function for an iteration is less than a first predetermined value, selecting a corresponding arrangement of the grating elements as an optimal arrangement of the grating elements;
- defining a desired second spectral response of the optimal arrangement of the grating elements;
- iteratively selecting different ones of the optimally arranged grating elements and modifying a refractive index of the selected grating elements;
- computing a second cost function for each arrangement of the selected grating elements having the modified refractive index; and
- if the computed second cost function for an iteration is less than a second predetermined value, selecting a corresponding arrangement of the selected grating elements as an optimal arrangement of the selected grating elements to provide said second spectral response.

24. The method of claim 23, wherein inducing changes of the refractive index of the selected grating elements includes disposing electrodes on the grating device and applying an electric potential to the electrodes disposed on the selected grating elements.

25. The method of claim 24, wherein the applied electrical potential is identical for all electrodes.

26. The method of claim 24, wherein the applied electrical potential is different between at least some of the electrodes.

27. The method of claim 24, wherein the applied electrical potential is a binary potential.

28. The method of claim 24, wherein the applied electrical potential is a multi-level potential.

29. The method of claim 23, wherein assigning a characteristic attribute includes assigning at least one of a width, a height, and a refractive index of the grating element, and a spacing between adjacent grating elements.

30. The method of claim 23, wherein the initial arrangement of selected grating elements comprises a random arrangement of grating elements.

31. The method of claim 23, wherein determining an actual spectral response of the grating device includes forming a Fourier transform of the physical arrangement of the grating elements.

32. The method of claim 23, wherein inducing changes of the refractive index of the selected grating elements includes applying thermal energy to the selected grating elements.

* * * * *

UNITED STATES PATENT AND TRADEMARK OFFICE
CERTIFICATE OF CORRECTION

PATENT NO. : 7,123,792 B1 Page 1 of 2
APPLICATION NO. : 09/914944
DATED : October 17, 2006
INVENTOR(S) : Mears et al.

It is certified that error appears in the above-identified patent and that said Letters Patent is hereby corrected as shown below:

| | |
|---|---|
| Title page – U.S. Patent Documents | Insert: -- 5,081,513   Jackson et al.   1/1992 -- |
| Column 1, Line 28 | Delete: "logitudinal"<br>Insert: -- longitudinal -- |
| Column 2, Line 33 | Delete: "gating"<br>Insert: -- grating -- |
| Column 7, Line 42 | Delete: "not this"<br>Insert: -- not have this -- |
| Column 8, Line 45 | Delete: " will hopping"<br>Insert: -- will be hopping -- |
| Column 9, Line 19 | Delete: "ket"<br>Insert: -- kept -- |
| Column 9, Line 20 | Delete: "througout"<br>Insert: -- throughout -- |
| Column 13, Line 40 | Delete: " intermdiate "<br>Insert: -- intermediate -- |
| Column 14, Line 14 | Delete: "or"<br>Insert: -- of -- |
| Column 14, Line 21 | Delete: " waveguide are "<br>Insert: -- waveguide and are -- |

UNITED STATES PATENT AND TRADEMARK OFFICE
CERTIFICATE OF CORRECTION

PATENT NO. : 7,123,792 B1
APPLICATION NO. : 09/914944
DATED : October 17, 2006
INVENTOR(S) : Mears et al.

It is certified that error appears in the above-identified patent and that said Letters Patent is hereby corrected as shown below:

Column 14, Line 53        Delete: "a/synchronous"
                          Insert: -- asynchronous --

Signed and Sealed this

Seventh Day of August, 2007

JON W. DUDAS
*Director of the United States Patent and Trademark Office*